US008830750B1

(12) United States Patent
Cheng et al.

(10) Patent No.: US 8,830,750 B1
(45) Date of Patent: Sep. 9, 2014

(54) DATA READING METHOD, AND CONTROL CIRCUIT, MEMORY MODULE AND MEMORY STORAGE APPARATUS USING THE SAME

(71) Applicant: Phison Electronics Corp., Miaoli (TW)

(72) Inventors: Kuo-Yi Cheng, Taipei (TW); Wei Lin, Taipei (TW); Yu-Hsiang Lin, Yunlin County (TW); Shao-Wei Yen, Kaohsiung (TW); Kuo-Hsin Lai, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 0 days.

(21) Appl. No.: 13/928,356

(22) Filed: Jun. 26, 2013

(30) Foreign Application Priority Data

May 6, 2013 (TW) .............................. 102116115 A

(51) Int. Cl.
*G11C 16/06* (2006.01)
*G11C 16/08* (2006.01)
*G11C 16/26* (2006.01)
(52) U.S. Cl.
CPC ................ *G11C 16/26* (2013.01); *G11C 16/08* (2013.01)
USPC ............ 365/185.09; 365/185.18; 365/185.12; 365/185.21

(58) Field of Classification Search
CPC ........... G11C 11/5642; G11C 16/0483; G11C 16/26; G11C 16/3431; G11C 29/00; G11C 13/004
USPC ............. 365/185.09, 185.18, 185.23, 185.21, 365/185.12, 185.03
See application file for complete search history.

(56) References Cited

U.S. PATENT DOCUMENTS 8,385,121 B2 * 2/2013 Sarin et al. ............... 365/185.12

* cited by examiner

*Primary Examiner* — David Lam
(74) *Attorney, Agent, or Firm* — Jianq Chyun IP Office

(57) ABSTRACT

A data reading method for a rewritable non-volatile memory module is provided. The method includes determining a corresponding read voltage based on a critical voltage distribution of memory cells of a word line. The method further includes: if the critical voltage distribution of the memory cells is a right-offset distribution, applying a set of right adjustment read voltage to the word line to read a plurality of bit data as corresponding soft values; and decoding the corresponding soft values to obtain page data stored in the memory cells. Herein, the set of right adjustment read voltage includes a plurality of positive adjustment read voltages and a plurality of negative adjustment read voltages and the number of the positive adjustment read voltages is more than the number of the negative adjustment read voltages. Accordingly, storage states of the memory cells can be identified correctly.

20 Claims, 15 Drawing Sheets

US 8,830,750 B1

DATA READING METHOD, AND CONTROL CIRCUIT, MEMORY MODULE AND MEMORY STORAGE APPARATUS USING THE SAME

CROSS-REFERENCE TO RELATED APPLICATION

This application claims the priority benefit of Taiwan application serial no. 102116115, filed on May 6, 2013. The entirety of the above-mentioned patent application is hereby incorporated by reference herein and made a part of this specification.

BACKGROUND

1. Technology Field

The present invention relates to a data reading method and a control circuit, a memory module and a memory storage apparatus using the method.

2. Description of Related Art

Along with the widespread of digital cameras, cell phones, and MP3 in recently years, the consumers' demand for storage media has increased drastically. Since a rewritable non-volatile memory has the characteristics of non-volatility of data, low power consumption, small volume, non-mechanical structure, and fast reading and writing speed, the rewritable non-volatile memory is the most adaptable memory to be applied in a portable electronic product, e.g., a notebook computer. A solid state drive (SSD) is a storage apparatus which utilizes a flash memory as its storage medium. Therefore, the flash memory industry has become a very popular part of the electronic industry in recent years.

FIG. 1 is a schematic diagram illustrating a flash memory device according to the related art.

Referring to FIG. 1, a flash memory device 1 includes a charge-trapping layer 2 for storing electrons, a control gate 3 for applying a voltage voltage, a tunnel oxide layer 4, and an interpoly dielectric layer 5. When it is intended to write data into the flash memory device 1, a threshold voltage of the flash memory device 1 may be changed by injecting electrons into the charge-trapping layer 2. Accordingly, a digital-level state of the flash memory device 1 is defined to implement a function of storing data. Here, the process of injecting the electrons to the charge-trapping layer 2 is referred to as a programming process. By contrast, when it is intended to remove the stored data, the injected electrons are removed from the charge-trapping layer 2, and thereby the flash memory device 1 is restored back to the default state before programming.

During writing and erasing operations, the flash memory device 1 deteriorates due to the frequent injection and removal of the electrons, thus increasing the speed of writing the electrons and extending the distribution of the threshold voltage. As a result, after the flash memory device 1 is programmed, the storage state of the flash memory device 1 is unlikely to be identified accurately, which results in the occurrence of error bits.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the invention is directed to a data reading method, a control circuit, a rewritable non-volatile memory module and a memory storage apparatus, which can correctly identify a storage state of memory cells which have worn.

In an exemplary embodiment of the present invention, a data read method for a rewritable non-volatile memory module is provided, wherein the rewritable non-volatile memory module has a plurality of memory cells, a plurality of word lines and a plurality of bit lines. The data reading method includes: determining a first read voltage corresponding to memory cells of a first word line among the word lines based on a critical voltage distribution of the memory cells of the first word line; and determining whether the critical voltage distribution of the memory cells of the first word line is a normal distribution, a right-offset distribution or a left-offset distribution. The data reading method also includes: if the critical voltage distribution of the memory cells of the first word line is the right-offset distribution, applying a first set of right adjustment read voltage corresponding to the first read voltage to the first word line to read a plurality of bit data as first soft values corresponding to the memory cells of the first word line; and decoding the first soft values corresponding to the memory cells of the first word line to obtain first page data stored in the memory cells of the first word line. Herein, the first set of right adjustment voltage includes a plurality of positive adjustment read voltages and a plurality of negative adjustment read voltages, each positive adjustment read voltage of the first set of right adjustment voltage is larger than the first read voltage, each negative adjustment read voltage of the first set of right adjustment voltage is smaller than the first read voltage, and the number of the positive adjustment read voltages of the first set of right adjustment voltage is larger than the number of the negative adjustment read voltages of the first set of right adjustment voltage.

In an exemplary embodiment of the present invention, a control circuit for reading data from a plurality of memory cells of a rewritable non-volatile memory module is provided. The control circuit includes an interface, an error checking and correcting circuit and a memory management circuit. The interface is configured to electrically connect to the memory cells, a plurality of word lines and a plurality of bit lines, and each of the memory cells electrically connects to one of the word lines and one of the bit lines. The memory management circuit is coupled to the interface and configured to determine a first read voltage corresponding to memory cells of a first word line among the word lines based on a critical voltage distribution of the memory cells of the first word line. Moreover, the memory management circuit is further configured to determine whether the critical voltage distribution of the memory cells of the first word line is a normal distribution, a right-offset distribution or a left-offset distribution. If the critical voltage distribution of the memory cells of the first word line is the right-offset distribution, the memory management circuit applies a first set of right adjustment read voltage corresponding to the first read voltage to the first word line to read a plurality of bit data as first soft values corresponding to the memory cells of the first word line. And, the memory management circuit is further configured to transmit the first soft values corresponding to the memory cells of the first word line to the error checking and correcting circuit and the error checking and correcting circuit decodes the first soft values corresponding to the memory cells of the first word line to obtain first page data stored in the memory cells of the first word line.

According to an exemplary embodiment of the present invention, a memory storage apparatus including a connector, a rewritable non-volatile memory module and a memory controller is provided. The connector is coupled to a host system. The rewritable non-volatile memory module has a plurality of memory cells, a plurality of word lines and a plurality of bit lines, and each of the memory cells electrically connects to one of the word lines and one of the bit lines. The memory controller is coupled to the connector and configured to determine a first read voltage corresponding to memory cells of a first word line among the word lines based on a critical voltage distribution of the memory cells of the first word line. Moreover, the memory controller is further configured to determine whether the critical voltage distribution of the memory cells of the first word line is a normal distribution, a right-offset distribution or a left-offset distribution. If the critical voltage distribution of the memory cells of the first word line is the right-offset distribution, the memory controller applies a first set of right adjustment read voltage corresponding to the first read voltage to the first word line to read a plurality of bit data as first soft values corresponding to the memory cells of the first word line. Moreover, the memory controller is configured to decode the first soft values corresponding to the memory cells of the first word line to obtain first page data stored in the memory cells of the first word line.

According to an exemplary embodiment of the present invention, a memory module including a plurality of word lines, a plurality of bit lines, a plurality of memory cells and a control circuit is provided, wherein each of the memory cells electrically connects to one of the word lines and one of the bit lines. The control circuit is coupled to the word lines, the bit lines, and the memory cells and configured to determine a first read voltage corresponding to memory cells of a first word line among the word lines based on a critical voltage distribution of the memory cells of the first word line. Moreover, the control circuit is further configured to determine whether the critical voltage distribution of the memory cells of the first word line is a normal distribution, a right-offset distribution or a left-offset distribution. If the critical voltage distribution of the memory cells of the first word line is the right-offset distribution, the control circuit applies a first set of right adjustment read voltage corresponding to the first read voltage to the first word line to read a plurality of bit data as first soft values corresponding to the memory cells of the first word line. Moreover, the control circuit is configured to decode the first soft values corresponding to the memory cells of the first word line to obtain first page data stored in the memory cells of the first word line.

In view of the above, the data reading method, the control circuit, the rewritable non-volatile memory module and the memory storage apparatus of the exemplary embodiments of the present invention can use suitable adjusted read voltage based on the critical voltage distribution to obtain soft values, thereby enhancing the capability of correcting data and preventing data stored in the memory cells from losing.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned features and advantages of the present invention more comprehensible, embodiments accompanying figures are described in detail below.

DESCRIPTION OF EMBODIMENTS

Figure 1:
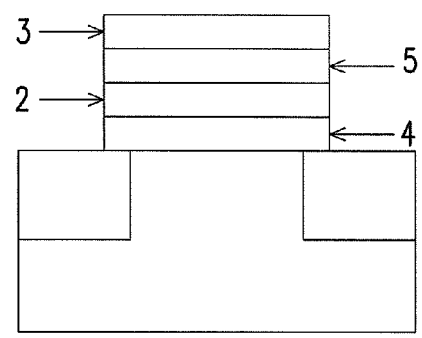
FIG. 1 is a schematic diagram illustrating a flash memory device according to the related art.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A memory storage apparatus (i.e., a memory storage system) typically includes a rewritable non-volatile memory module and a controller (i.e., a control circuit). The memory storage apparatus is usually used together with a host system, such that the host system can write data into or read data from the memory storage apparatus.

Figure 2:
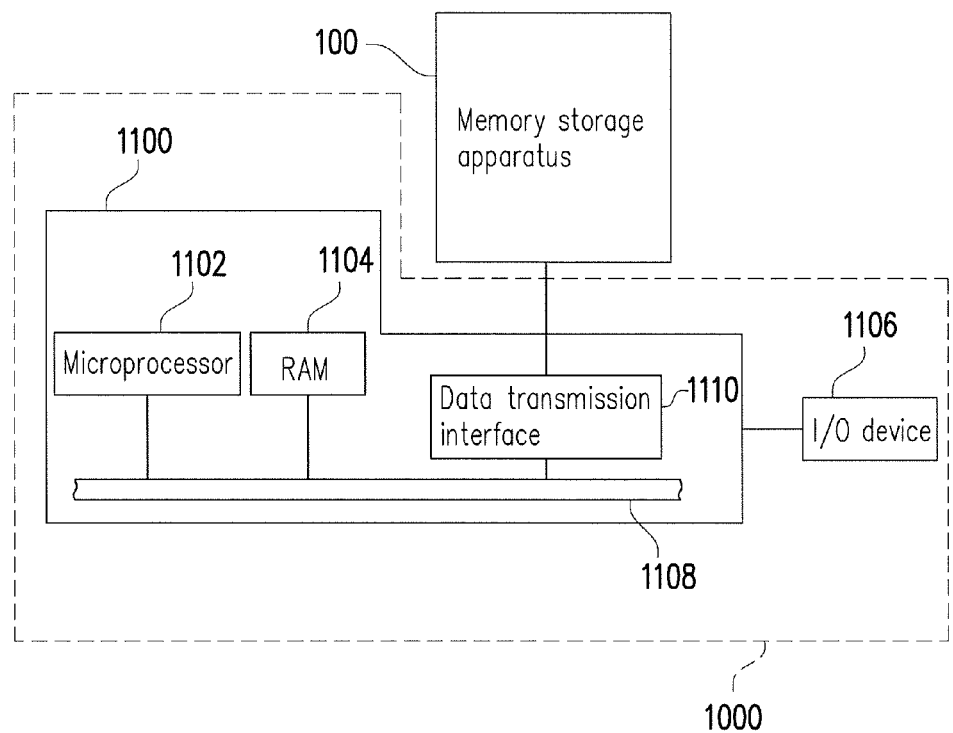
FIG. 2 illustrates a host system and a memory storage apparatus according to an exemplary embodiment.

FIG. 2 illustrates a host system and a memory storage apparatus according to an exemplary embodiment.

Figure 3:
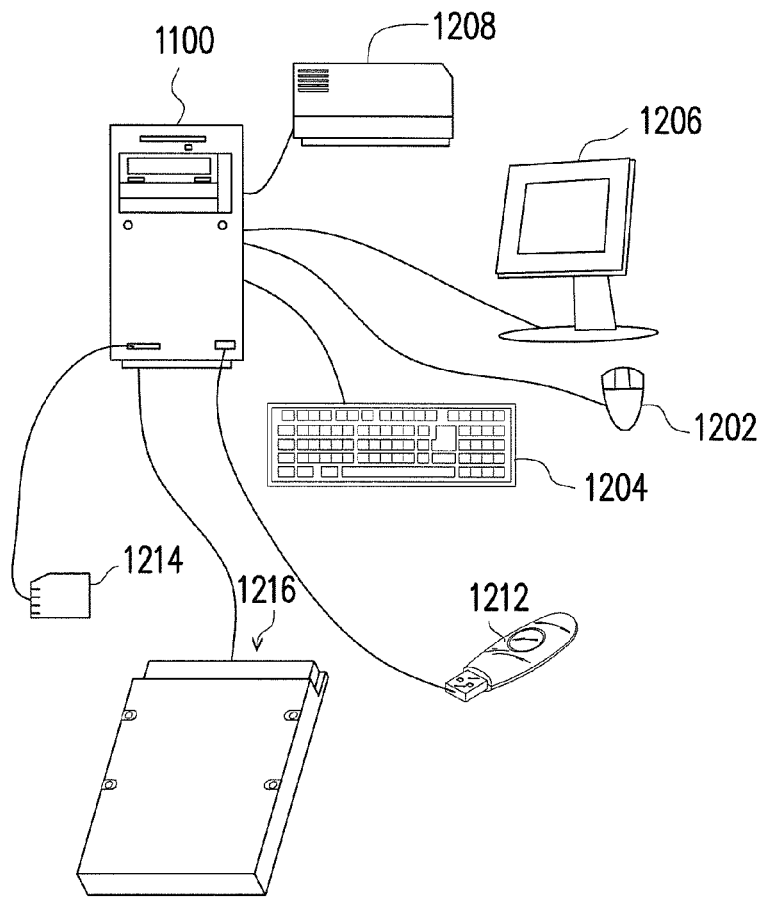
FIG. 3 schematically illustrates a computer, an input/output (I/O) device, and a memory storage apparatus according to an exemplary embodiment.

Referring to FIG. 2, a host system 1000 usually includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 3. It should be understood that, the devices depicted in FIG. 3 should not be construed as limitations to the present disclosure, and the I/O device 1106 may include other devices as well.

In the exemplary embodiment of the present invention, the memory storage apparatus 100 is coupled to other devices of the host system 1000 through the data transmission interface 1110. By using the microprocessor 1102, the RAM 1104, and the I/O device 1106, the data can be written into or read from the memory storage apparatus 100. For instance, the memory storage apparatus 100 may be a non-volatile memory storage apparatus, such as a flash drive 1212, a memory card 1214, or a solid state drive (SSD) 1216 as shown in FIG. 3.

Figure 4:
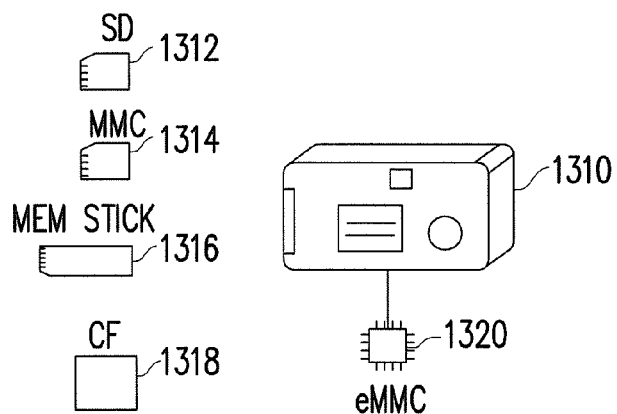
FIG. 4 illustrates a host system and a memory storage apparatus according to an exemplary embodiment.

Generally, the host system 1000 can substantially be any system used together with the memory storage apparatus 100 for storing data. Even though the host system 1000 is described as a computer system in the present exemplary embodiment, the host system 1000 in another exemplary embodiment may be a digital camera, a video camera, a communication device, an audio player, a video player, and so on. For instance, if the host system is a digital camera (video camera) 1310, the rewritable non-volatile memory storage apparatus is an SD card 1312, an MMC card 1314, a memory stick 1316, a CF card 1318n or an embedded storage apparatus 1320 (as shown in FIG. 4). The embedded storage device 1320 includes an embedded MMC (eMMC). It should be noted that the eMMC is directly coupled to a substrate of the host system.

Figure 5:
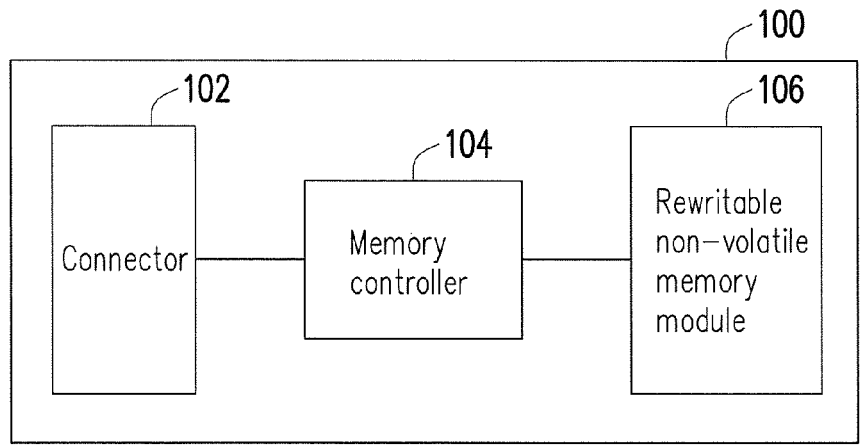
FIG. 5 is a schematic block diagram illustrating a memory storage apparatus according to the first exemplary embodiment.

FIG. 5 is a schematic block diagram illustrating a memory storage apparatus according to the first exemplary embodiment.

Referring to FIG. 5, the memory storage apparatus 100 includes a connector 102, a memory controller 104, and a rewritable non-volatile memory module 106.

In the present exemplary embodiment, the connector 102 is a connector complying with universal serial bus (USB). However, it should be understood that the present invention is not limited thereto, and the connector 102 may also comply with the parallel advanced technology attachment (PATA) standard, the Institute of Electrical and Electronic Engineers (IEEE) 1394 standard, the peripheral component interconnect (PCI) express standard, the secure digital (SD) standard, the serial advanced technology attachment (SATA) standard, the ultra high speed-I (UHS-I) interface standard, the ultra high speed-II (UHS-II) interface standard, the memory stick (MS) interface standard, the multi media card (MMC) interface standard, the eMMC interface standard, the universal flash storage (UFS) interface standard, the compact flash (CF) standard, the integrated device electronics (IDE) standard, or other suitable standards.

The memory controller 104 is configured to execute a plurality of logic gates or control commands which are implemented in a hardware form or in a firmware form and performing the operations such as data writing, reading or erasing in the rewritable non-volatile memory module 106 according to the command of the host system 1000.

The rewritable non-volatile memory module 106 is coupled to the memory controller 104 and is configured to store the data written by the host system 1000. In the present exemplary embodiment, the rewritable non-volatile memory module 106 is a multi level cell (MLC) NAND flash memory module, i.e., a memory cell can store 2 bits of data, a trinary level cell (TLC) NAND flash memory module (i.e., a memory cell can store 3 bits of data), other flash memory module or other memory module having the same characteristic.

Figure 6:
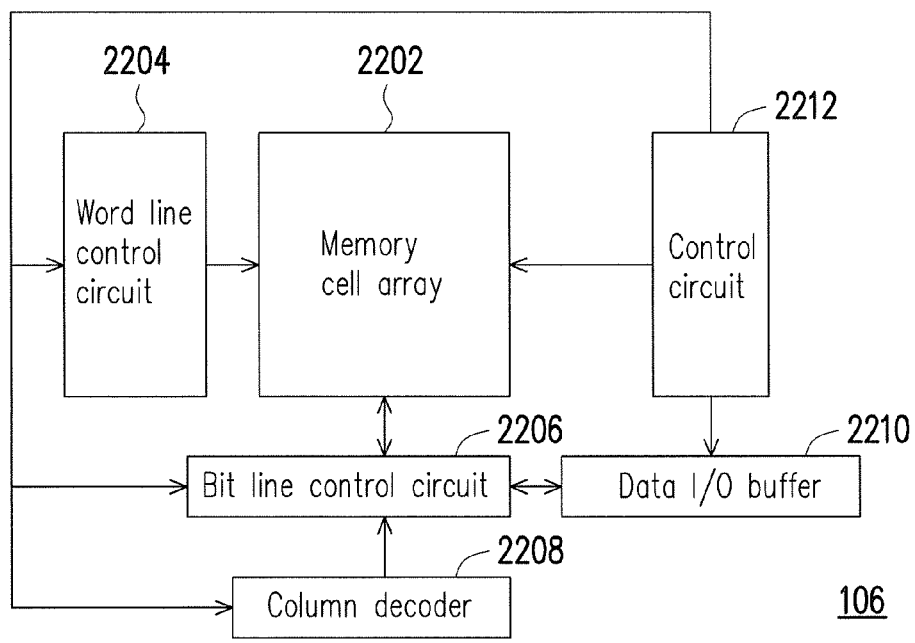
FIG. 6 is a schematic block diagram of a rewritable non-volatile memory module according to an exemplary embodiment.

FIG. 6 is a schematic block diagram of a rewritable non-volatile memory module according to an exemplary embodiment.

Referring to FIG. 6, the rewritable non-volatile memory module 106 includes a memory cell array 2202, a word line control circuit 2204, a bit line control circuit 2206, a column decoder 2208, a data input/output (I/O) buffer 2210, and a control circuit 2212.

Figure 7:
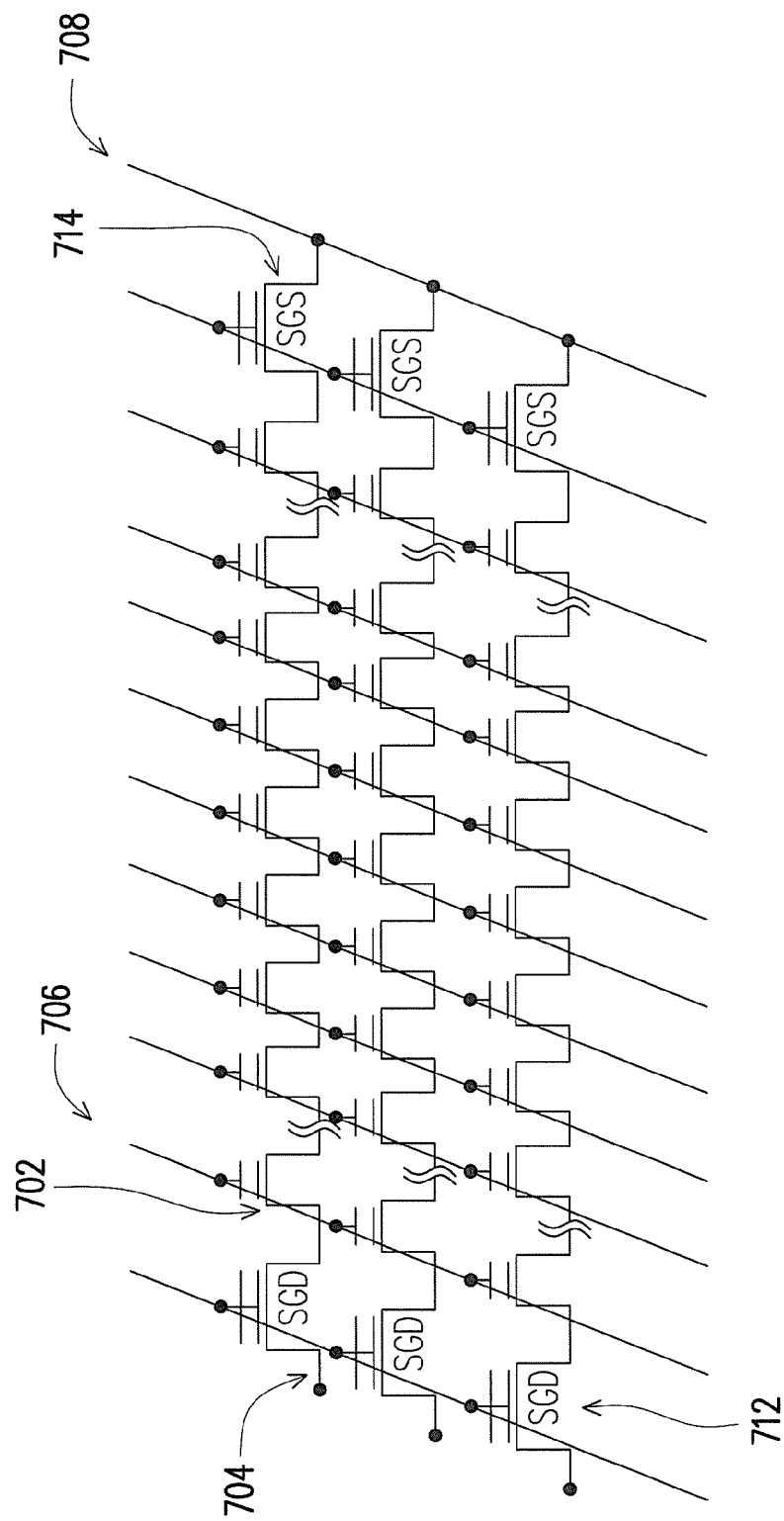
FIG. 7 is a schematic diagram illustrating a memory cell array according to an exemplary embodiment.

The memory cell array 2202 includes a plurality of memory cells 702 for storing data, a plurality of select gate drain (SGD) transistors 712, a plurality of select gate source (SGS) transistors 714, a plurality of bit lines 704 for connecting the memory cells, a plurality of word lines 706, and a common source line 708 (as shown in FIG. 7). The memory cells 702 are disposed on the cross points of the bit lines 704 and the word lines 706 as an array. When a write command or a read command is received from the memory controller 104, the control circuit 2212 controls the word line control circuit 2204, the bit line control circuit 2206, the column decoder 2208, and the data I/O buffer 2210 to write data into the memory cell array 2202 or read data from the memory cell array 2202, wherein the word line control circuit 2204 is configured to control the voltage applied to the word lines 706, the bit line control circuit 2206 is configured to control the voltage applied to the bit lines 704, the column decoder 2208 selects the corresponding bit line according to the decoding column address in the command, and the data I/O buffer 2210 is configured to store the data temporarily.

The rewritable non-volatile memory module 106 is an MLC NAND flash memory module which employs a plurality of gate voltages for representing a multi-bit data. To be specific, each memory cell of the memory cell array 2202 has a plurality of states, and the states are distinguished by a plurality of threshold voltages.

Figure 8:
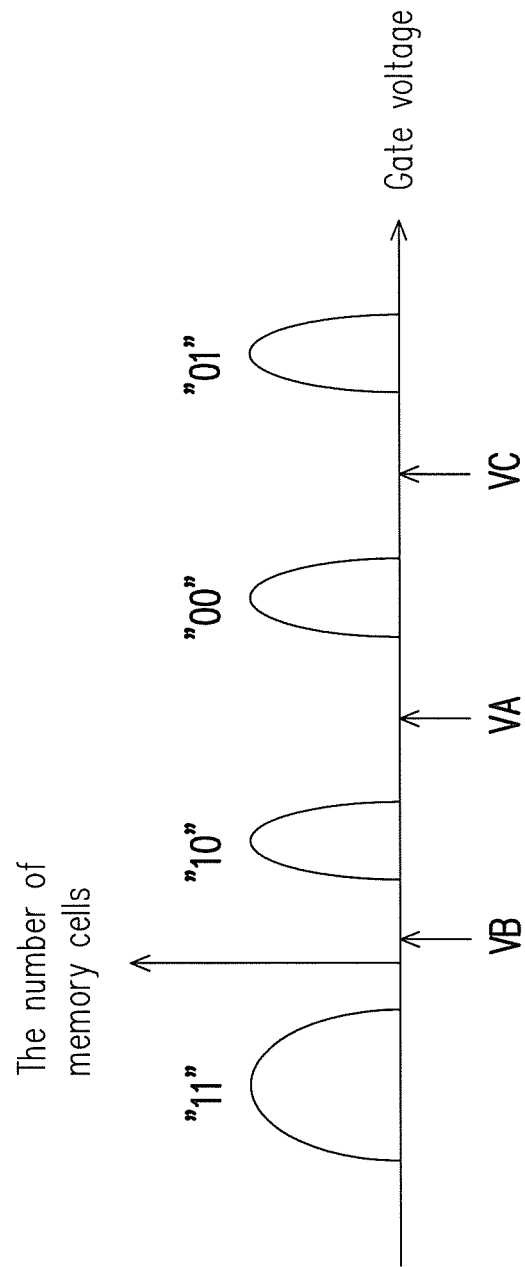
FIG. 8 is a statistical distribution diagram illustrating gate voltages corresponding to data stored in a memory array according to an exemplary embodiment.

FIG. 8 is a statistical distribution diagram illustrating gate voltages corresponding to data stored in a memory array according to an exemplary embodiment.

Referring to FIG. 8, in an exemplary MLC NAND flash memory, the gate voltages in each memory cell may be categorized into 4 storage states according to a first threshold voltage VA, a second threshold voltage VB, and a third threshold voltage VC, and these storage states respectively represent "11", "10", "00", and "01". In other words, each storage state includes the least significant bit (LSB) and the most significant bit (MSB). In the present exemplary embodiment, the first bit from the left of the storage states (i.e., "11", "10", "00", and "01") is the LSB, and the second bit from the left of the storage states is the MSB. Therefore, in the first exemplary embodiment, each memory cell stores 2 bits of data. It should be understood that the gate voltages and the corresponding storage states illustrated in FIG. 8 are only examples. In another exemplary embodiment of the present invention, the gate voltages and the corresponding storage states may also have such an arrangement as "11", "10", "01", and "00" along with the increase in the gate voltages. Alternatively, the storage states corresponding to the gate voltages may also be values obtained by mapping or inverting actual storage values. Besides, in yet anther exemplary embodiment, the first bit from the left may be defined as the MSB, and the second bit from the left may be defined as the LSB.

In a case where each memory cell stores 2 bits of data, the memory cells on the same word line constitute a storage space of 2 physical pages (i.e., a lower page and an upper page). Namely, the LSB of each memory cell corresponds to the lower page, and the MSB of each memory cell corresponds to the upper page. In addition, several physical pages in the memory cell array 2202 constitute a physical block, and the physical block is the smallest unit for erasing data. That is to say, each of the physical blocks has a minimum number of memory cells for being erased altogether.

To write (or to program) data to a memory cell of the memory cell array 2202, a voltage (e.g., a gate voltage) applied to a certain terminal in the memory cell is controlled to change the electron volume in a charge-trapping layer in the gate, so that the conduction state of the channel of the memory cell is changed to present a different storage state. For instance, when the data of the lower page is 1, and the data of the upper page is 1 as well, the control circuit 2212 controls the word line control circuit 2204 not to change the gate voltage in the memory cell, so as to keep the storage state of the memory cell as "11". When the data of the lower page is 1, and the data of the upper page is 0, the control circuit 2212 controls the word line control circuit 2204 to change the gate voltage in the memory cell, so as to change the storage state of the memory cell to "10". When the data of the lower page is 0, and the data of the upper page is 0 as well, the control circuit 2212 controls the word line control circuit 2204 to change the gate voltage in the memory cell, so as to change the storage state of the memory cell to "00". When the data of the lower page is 0, and the data of the upper page is 1, the control circuit 2212 controls the word line control circuit 2204 to change the gate voltage in the memory cell, so as to change the storage state of the memory cell to "01".

Figure 9:
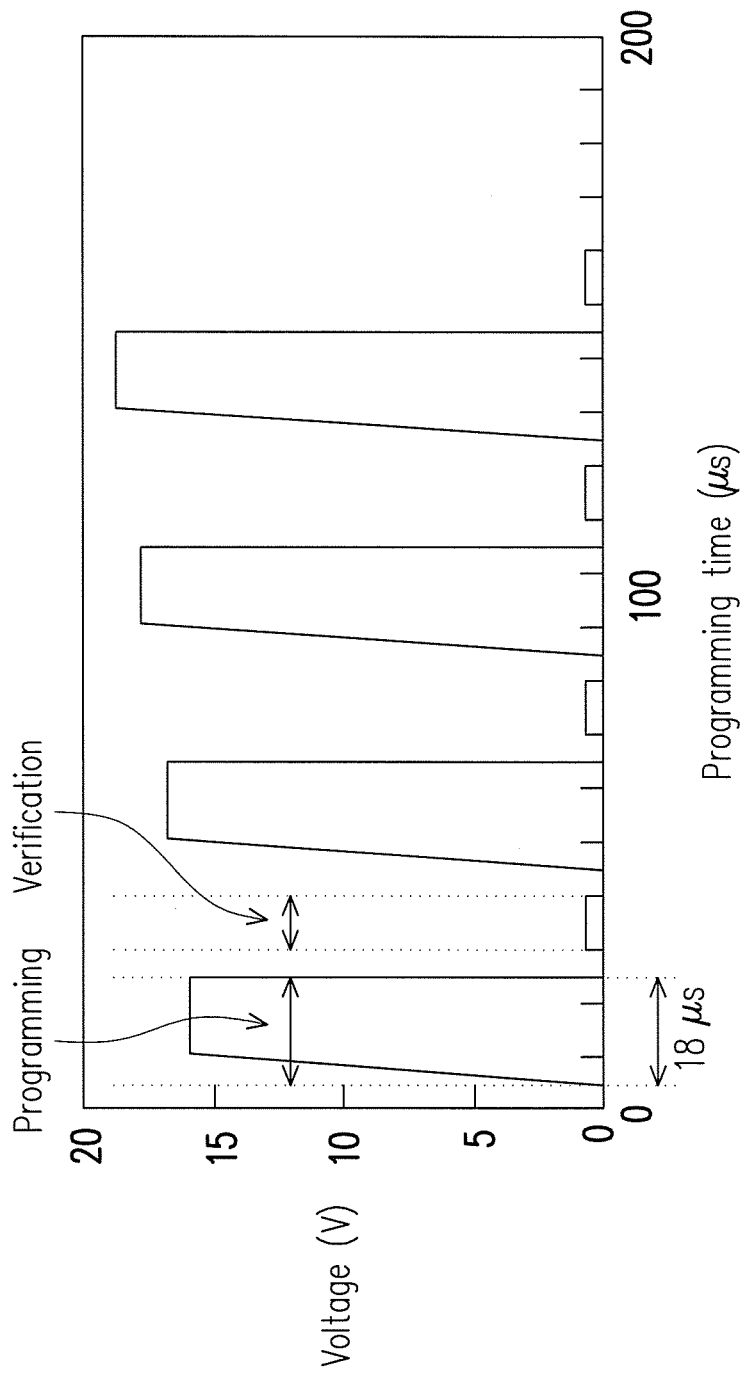
FIG. 9 is a schematic diagram of programming a memory cell according to an exemplary embodiment.

FIG. 9 is a schematic diagram of programming a memory cell according to an exemplary embodiment.

Referring to FIG. 9, in the present exemplary embodiment, the memory cell is programmed through applying a pulse writing/threshold voltage verifying method. Particularly, when data are to be written into the memory cell, the memory controller 104 determines an initial writing voltage and a writing voltage pulse time and instructs the control circuit 2212 of the rewritable non-volatile memory module 106 to program the memory cell according to the determined initial writing voltage and the determined writing voltage pulse time, thereby writing the data into the memory cell. The memory controller 104 then verifies the memory cell by means of a verification voltage, so as to determine whether the memory cell is in the correct storage state. If the memory cell is not programmed to be in the correct storage state, the memory controller 104 instructs the control circuit 2212 to re-program the memory cell according to the determined writing voltage pulse time and a new writing voltage (also referred to as a repetitive writing voltage) obtained by adding an incremental-step-pulse programming (ISPP) adjustment value to the initial writing voltage. By contrast, if the programmed memory cell is in the correct storage state, it indicates that the data are correctly written into the memory cell. For instance, the initial writing voltage is set as 16 V, the writing voltage pulse time is set as 18 microseconds (μs), and the ISPP adjustment value is set as 0.6 V; however, the present invention is not limited thereto.

Figure 10:
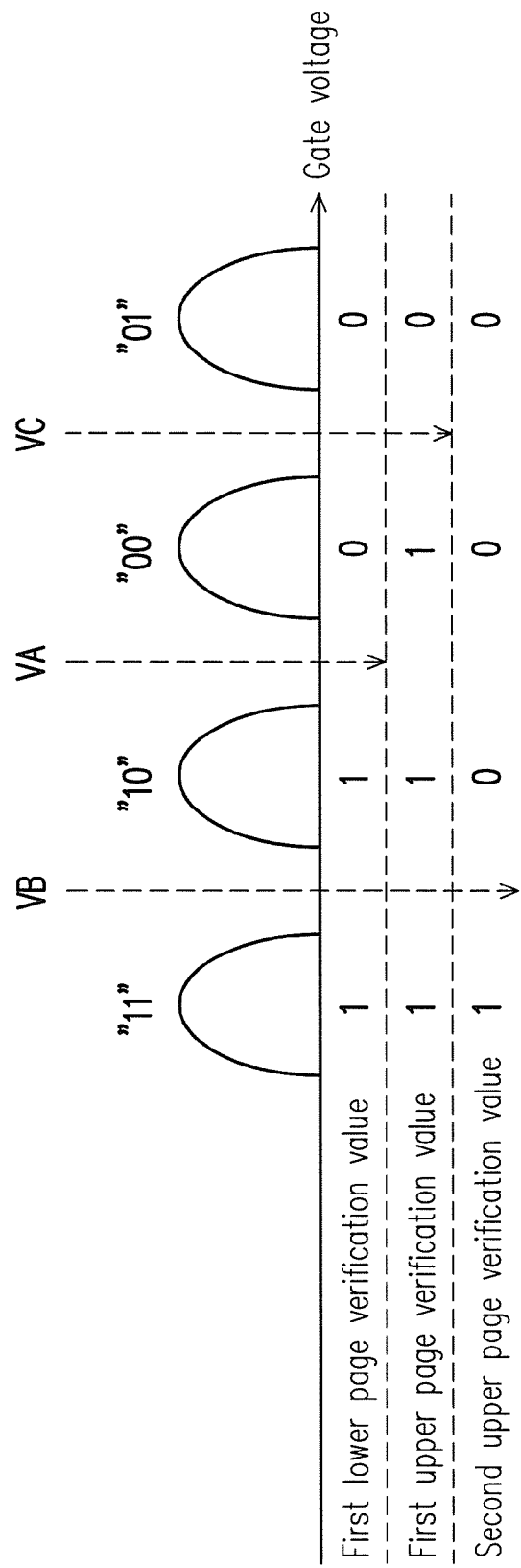
FIG. 10 is a schematic diagram of reading data from a memory cell according to an exemplary embodiment.

FIG. 10 is a schematic diagram of reading data from a memory cell according to an exemplary embodiment, wherein a MLC NAND flash memory is taken as an example.

Referring to FIG. 10, in order to read data from a memory cell of the memory cell array 2202, a voltage for reading data is applied to a control gate; by means of the conduction state of a channel of the memory cell, the data stored in the memory cell may be indicated. Here, the channel of the memory cell refers to an electrical connection path between the bit lines and the source lines of the memory cell (e.g., the path between the source and the drain of the memory cell). In an operation for reading data from a lower page, the word line control circuit 2204 applies the first read voltage VA (as the voltage for reading data) to the memory cell and determines the value of data of the lower page according to whether the channel of the memory cell is conducted and the corresponding expression (1):

$$LSB = (VA)Lower\_pre1 \qquad (1)$$

In the expression (1), (VA)Lower_pre1 represents a first lower page verification value obtained by applying the first read voltage VA.

For instance, when the first read voltage VA is lower than the gate voltage in the memory cell, the channel of the memory cell is not conducted, and a first lower page verification value, which is '0', is output. Accordingly, the LSB is indicated to be in a first state as 0. For instance, when the first read voltage VA is higher than the gate voltage in the memory cell, the channel of the memory cell is conducted, and the first lower page verification value, which is '1', is output. Accordingly, the LSB is indicated as being in a second state. Here, the first state is indicated as "0," and the second state is indicated as "1". That is, the gate voltage for presenting the LSB as "1" and the gate voltage for presenting the LSB as "0" may be distinguished by the first read voltage VA.

In an operation for reading data from an upper page, the word line control circuit 2204 respectively applies the second read voltage VB and the third read voltage VA to the memory cell and determines the value of data of the upper page according to whether the channel of the memory cell is conducted and the corresponding expression (2):

$$MSB = ((VB)Upper\_pre2) \operatorname{xor}(\sim(VC)Upper\_pre1) \qquad (2)$$

In the expression (2), (VC)Upper_pre1 represents a first upper page verification value obtained by applying the third read voltage VC, and (VB)Upper_pre2 represents a second upper page verification value obtained by applying the second read voltage VB, wherein the symbol "~" represents inversion. Additionally, in the present exemplary embodiment, when the third read voltage VC is lower than the gate voltage in the memory cell, the channel of the memory cell is not conducted, and the first upper page verification value ((VC)Upper_pre1), which is '0', is output; when the second read voltage VB is lower than the gate voltage in the memory cell, the channel of the memory cell is not conducted, and a second upper page verification value ((VB)Upper_pre2), which is '0', is output.

Thus, in the present exemplary embodiment, according to the expression (2), it is assumed that the third read voltage VC and the second read voltage VB are both lower than the gate voltage in the memory cell. When the third read voltage VC is applied, the channel of the memory cell is not conducted, and a first upper page verification value, which is '0', is output; when the second read voltage VB is applied, the channel of the memory cell is not conducted, and a second upper page verification value, which is '0', is output. At this time, the MSB is indicated as being in the second state, i.e., "1".

For instance, it is assumed that the third read voltage VC is higher than the gate voltage of the memory cell, and the second read voltage VB is lower than the gate voltage of the memory cell. When the third threshold voltage VC is applied, the channel of the memory cell is conducted, and a first upper page verification value, which is '1', is output; when the second read voltage VB is applied, the channel of the memory cell is not conducted, and a second upper page verification value, which is '0', is output. At this time, the MSB is indicated as being in a first state, i.e., "0".

For instance, it is assumed that the third read voltage VC and the second read voltage VB are both higher than the gate voltage of the memory cell. When the third read voltage VC is applied, the channel of the memory cell is conducted, and a first upper page verification value, which is '1', is output; when the second read voltage VB is applied, the channel of the memory cell is conducted, and a second upper page verification value, which is '1', is output. At this time, the MSB is indicated as being in the second state, i.e., "1"

It should be understood that the exemplary MLC NAND flash memory described herein should not be construed as limitation to the present invention, and data can be read from any other MLC NAND flash memory through the principle described above.

Figure 11:
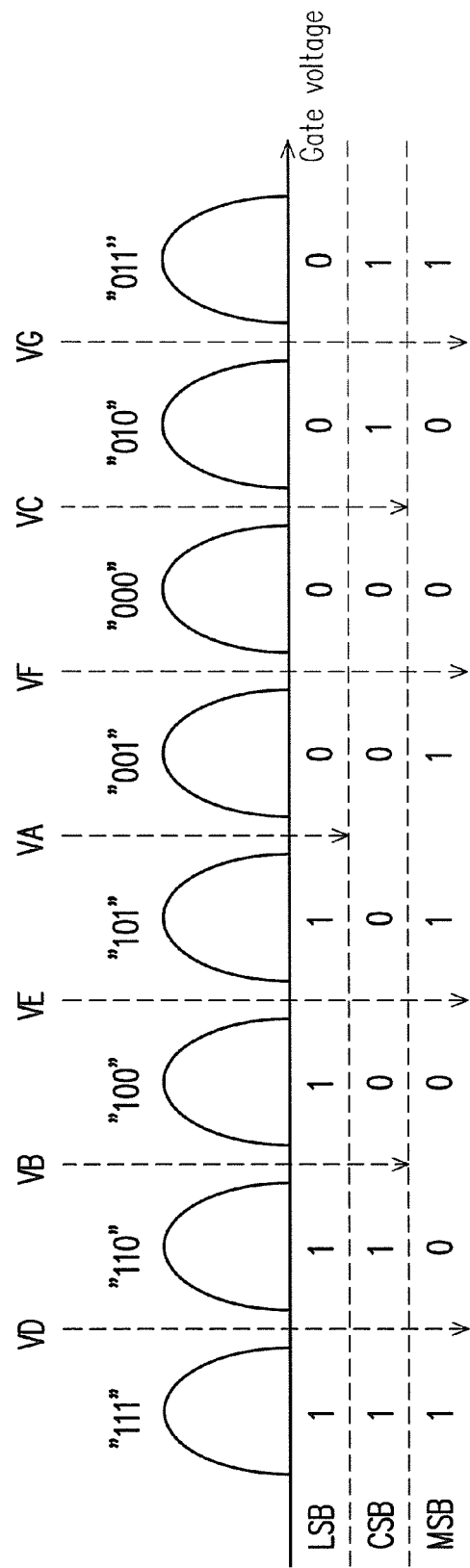
FIG. 11 is a schematic diagram of reading data from a memory cell according to another exemplary embodiment.

For instance, in an exemplary TLC NAND flash memory (as shown in FIG. 11), each storage state includes an LSB (the first bit from the left), a center significant bit (CSB, the second bit from the left), and an MSB (the third bit from the left), wherein the LSB corresponds to a lower page, the CSB corresponds to a center page, and the MSB corresponds to an upper page. In this example, the gate voltage in each memory cell is distinguished into 8 storage states (i.e., "111", "110", "100", "101", "001", "000", "010", and "011") according to a first read voltage VA, a second read voltage VB, a third read voltage VC, a fourth read voltage VD, a fifth read voltage VE, a sixth read voltage VF, and a seventh read voltage VG.

Figure 12:
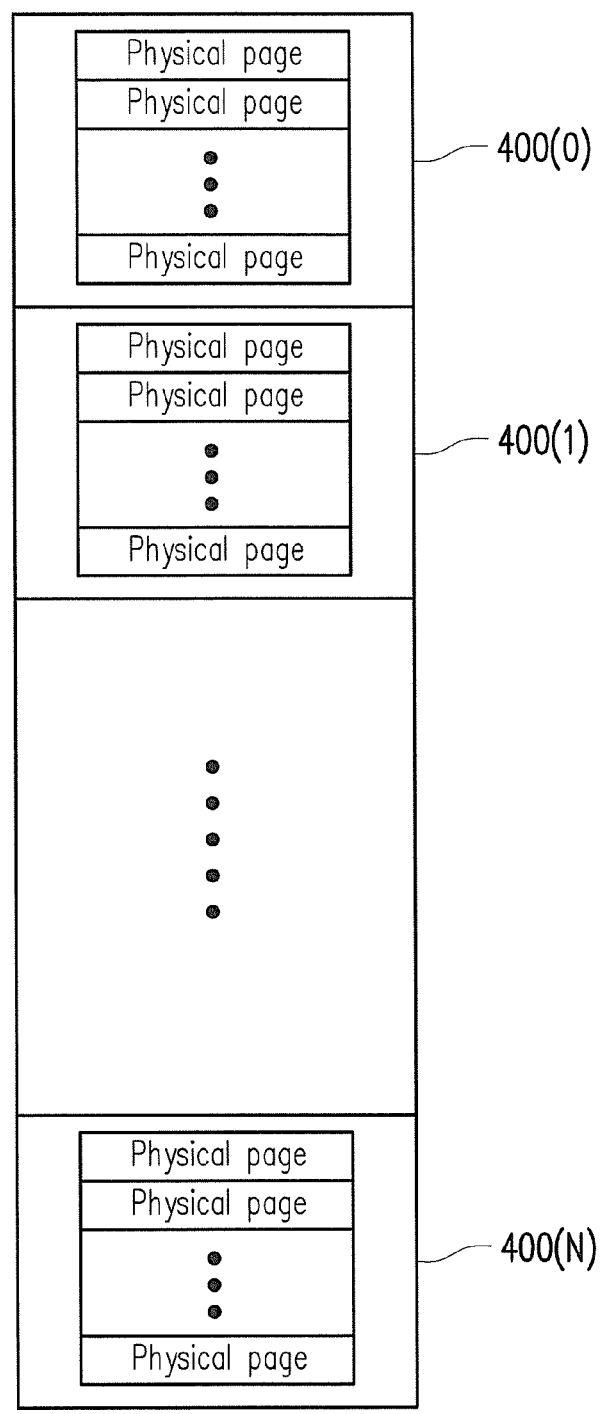
FIG. 12 is a schematic diagram of managing a rewritable non-volatile memory module according to an exemplary embodiment of the present invention.

FIG. 12 is a schematic diagram of managing a rewritable non-volatile memory module according to an exemplary embodiment of the present invention.

Referring to FIG. 12, the memory controller 104 (or the memory management circuit 202) writes data into the memory cells 702 of the rewritable non-volatile memory module 106 in units of each physical page and erases data from the memory cells 702 of the rewritable non-volatile memory module 106 in units of each physical block. Particularly, the memory cells 702 in the rewritable non-volatile memory module 106 constitute a plurality of physical pages, and the physical pages constitute a plurality of physical blocks 400(0)-400(N). Each physical block is the smallest erasing unit. Namely, each physical block contains the least number of memory cells which are erased all together. Each physical page is the smallest unit for programming data. Namely, each physical page is the smallest unit for writing data. Each physical page usually includes a data bit area and a redundant bit area. The data bit area includes a plurality of physical access address for storing user data, and the redundant bit area is used for storing system data (e.g., error checking and correcting (ECC) codes). For instance, in an exemplary TLC NAND flash memory, the LSBs of the memory cells on the same word line constitute a lower physical page; the CSBs of the memory cells on the same word line constitute a center physical page; the MSBs of the memory cells on the same word line constitute an upper physical page.

Figure 13:
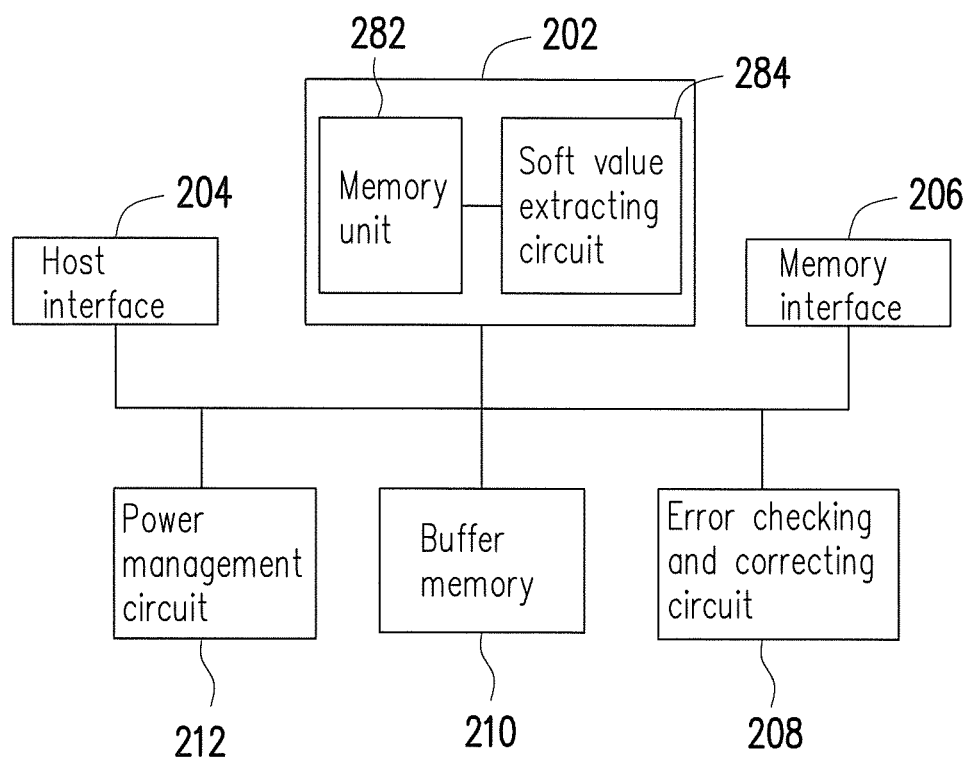
FIG. 13 is a schematic block diagram illustrating a memory controller according to an exemplary embodiment.

FIG. 13 is a schematic block diagram illustrating a memory controller according to an exemplary embodiment. It should be understood that the memory controller depicted in FIG. 13 is merely exemplary and should not be construed as a limitation to the present invention.

Referring to FIG. 13, the memory controller 104 includes a memory management circuit 202, a host interface 204, a memory interface 206 and an error checking and correcting circuit 208.

The memory managing circuit 202 is configured to control the whole operation of the memory controller 104. Particularly, the memory management circuit 202 has a plurality of control instructions; when the memory storage apparatus 100 is operated, the control instructions are executed to perform a data writing operation, a data reading operation, a data erasing operation, and so on.

In the present exemplary embodiment, the control instructions of the memory managing circuit 202 are implemented in a firmware form. For example, the memory managing circuit 202 includes a microprocessor unit (not shown) and a read-only memory (ROM, not shown), wherein the control instructions are burnt in the read-only memory. When the memory storage apparatus 100 is operated, the control instructions are executed by a microprocessor unit to write, read, and erase data.

In another exemplary embodiment of the present invention, the control commands of the memory management circuit 202 may also be stored in a specific block (for example, a system block in a memory module exclusively used for storing system data) of the rewritable non-volatile memory module 106 as a programming code. Moreover, the memory management circuit 202 includes a microprocessor unit (not shown), a read-only memory (ROM, not shown) and a random access memory (not shown). In particular, the ROM has boot codes, and when the memory controller 104 is enabled, the microprocessor unit first executes the boot codes to load the control instructions from the rewritable non-volatile memory module 106 into the RAM of the memory management circuit 202. The microprocessor unit then executes the control instructions to write, read, and erase data.

Furthermore, as in another exemplary embodiment, the control instructions in the memory management circuit 202 are implemented in a hardware form. For example, the memory management circuit 202 includes a micro controller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the micro controller. The memory cell management circuit is configured to manage physical blocks of the rewritable non-volatile memory module 106. The memory writing circuit is configured to issue a write command to the rewritable non-volatile memory module 106 for writing data thereto. The memory reading circuit is configured to issue a read command to the rewritable non-volatile memory module 106 for reading data therefrom. The memory erasing circuit is configured to issue an erase command to the rewritable non-volatile memory module 106 for erasing data therefrom. The data processing circuit is configured to process data to be written to the rewritable non-volatile memory module 106 or data read from the rewritable non-volatile memory module 106.

The host interface 204 is coupled to the memory management circuit 202 and configured to receive and identify the commands and the data transmitted by the host system 1000. Namely, the commands and data transmitted by the host system 1000 are passed to the memory management circuit 202 through the host interface 204. In the present exemplary embodiment, the host interface 204 complies with the USB standard. However, it should be understood that the present invention is not limited thereto, and the host interface 204 may comply with the PATA standard, the IEEE 1394 standard, the PCI express standard, the SD standard, the SATA standard, the UHS-I interface standard, the UHS-II interface standard, the MS standard, the MMC standard, the eMMC interface standard, the UFS interface standard, the CF standard, the IDE standard, or other suitable data transmission standards.

The memory interface 206 is coupled to the memory management circuit 202 for accessing the rewritable non-volatile memory module 106. In other words, the data to be written into the rewritable non-volatile memory module 106 is converted to an acceptable format for the rewritable non-volatile memory module 106 by the memory interface 206.

The error checking and correcting circuit 208 is coupled to the memory management circuit 202 and configured to perform an error checking and correcting procedure to assure the accuracy of data. To be specific, when the memory management circuit 202 reads data from the memory module 106, the error checking and correcting circuit 208 executes the ECC procedure for the read data. For example, in the exemplary embodiment, the error checking and correcting circuit 208 is a low density parity check (LDPC) circuit and stores a log likelihood ratio (LLR) value table. When the memory management circuit 202 reads data from the rewritable non-volatile memory module 106, the error checking and correcting circuit 208 executes the ECC procedure according to the read data and a corresponding LLR value in the LLR value table. It should be understood that the error checking and correcting circuit 208 may be a turbo code circuit in another exemplary embodiment.

In an exemplary embodiment of the present invention, the memory controller 104 further includes a buffer memory 210 and a power management circuit 212.

The buffer memory 210 is coupled to the memory management circuit 202 and configured to temporarily store the data and commands from the host system 1000 or the data from the rewritable non-volatile memory module 106.

The power managing circuit 212 is coupled to the memory management circuit 202 and configured to control the power of the memory storage apparatus 100.

When reading data from memory cells, the memory controller 104 (or the memory management circuit 202) indicates the control circuit 2212 of the rewriteable non-volatile module 106 to apply the read voltage set to a word line connected to the memory cells to be read, thereby verifying the conduction state of the channels of the memory cells. In particular, during writing and erasing operations, a part of the structure (e.g., tunnel oxide layer) of the memory cells 702 in the rewritable non-volatile memory module 106 deteriorates due to the frequent injection and removal of the electrons, thus increasing the speed of writing the electrons and extending the distribution of the threshold voltage (as the dotted lines shown in FIG. 14).

Figure 14:
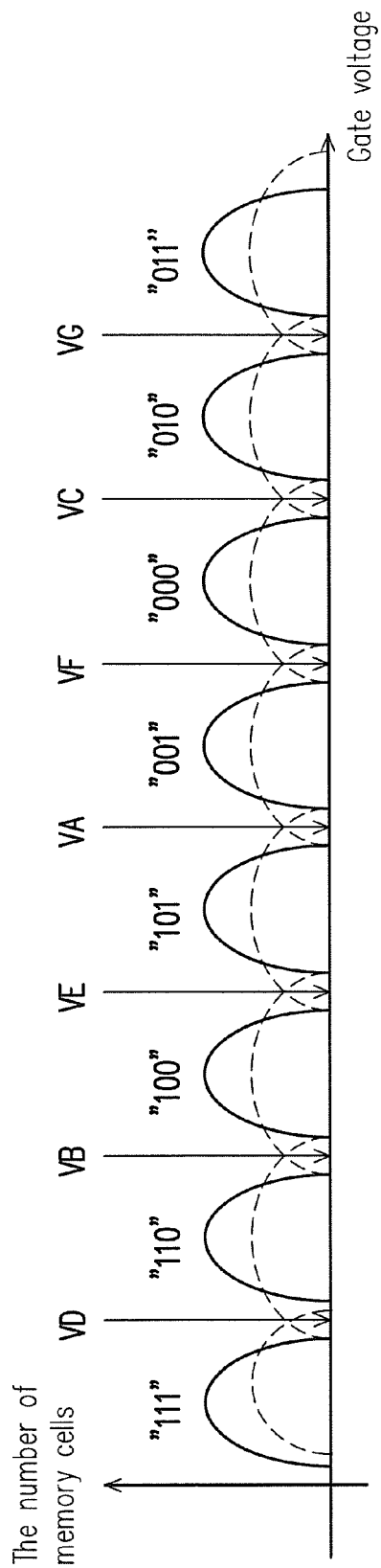
FIG. 14 is a statistical distribution diagram illustrating gate voltages corresponding to data stored in a memory array after the memory cells of the memory array are programmed and erased for many times according to an exemplary embodiment.

In the present exemplary embodiment, the memory controller 104 (or the memory management circuit 202) determines read voltages according to the critical voltage distribution of the memory cells of the word lines. For example, in an exemplary TLC NAND flash memory, the memory controller 104 (or the memory management circuit 202) searches or tracks the relative minimum point in the critical voltage distribution of the memory cells connected to a word line to set the first read voltage VA, the second read voltage VB, the third read voltage VC, the fourth read voltage VD, the fifth read voltage VE, the sixth read voltage VF and the seventh read voltage VG (as shown in FIG. 14).

In the present exemplary embodiment, the memory management circuit 202 includes a memory unit 282 and a soft value extracting circuit 284.

The memory unit 282 is configured to record the read voltages set based on a current critical voltage distribution of the memory cells, such as the first read voltage VA, the second read voltage VB, the third read voltage VC, the fourth read voltage VD, the fifth read voltage VE, the sixth read voltage VF, and the seventh read voltage VG. For example, the memory management circuit 202 may set corresponding read voltages for each word line, and the setting of the read voltages are recorded in the memory unit 282. Then, when a read operation is performed, different read voltages are applied according to different word lines.

The soft value extracting circuit 284 is coupled to the memory unit 282 and configured to apply adjustment read voltages to the memory cells to read bit data as soft values of the memory cells.

To be specific, as described above, in the read operation, the memory controller 104 (or the memory management circuit 202) applies read voltages to the word lines to get bit data. Herein, the bit data gotten by applying the read voltages is referred to as "hard values". As described above, when the re-writable non-volatile memory module 106 is unused for long-term or frequently erased or leakage of electricity occurs in the memory cells of the re-writable non-volatile memory module 106, the float voltages of the memory cells of the re-writable non-volatile memory module 106 may change and thus error bits may occur. Therefore, the error checking and correcting circuit 208 may execute an error checking and correcting procedure according to the gotten hard values to output corrected data, thereby ensuring data accuracy. In particular, too many error bits may occur in bit data gotten by applying read voltages to memory cells due to the serious wear of the memory cells, such that the error checking and correcting circuit 208 can not decode the bit data to generate corrected data. In order to solve the problem, in the present exemplary embodiment, the memory controller 104 (or the memory management circuit 202) may control the soft value extracting circuit 284 applying adjustment read voltages to memory cells to read bit data as soft values of the memory cells, and provides the gotten soft values to the error checking and correcting circuit 208. Therefore, the error checking and correcting circuit 208 may successfully execute the error checking and correcting procedure according to more information from the gotten soft values.

In the present exemplary embodiment, the memory controller 104 (or the memory management circuit 202) identifies an offset situation of a critical voltage distribution of memory cells to be read and selects a suitable set of adjustment read voltage to obtain soft values from the memory cells according to the offset situation.

Figure 15:
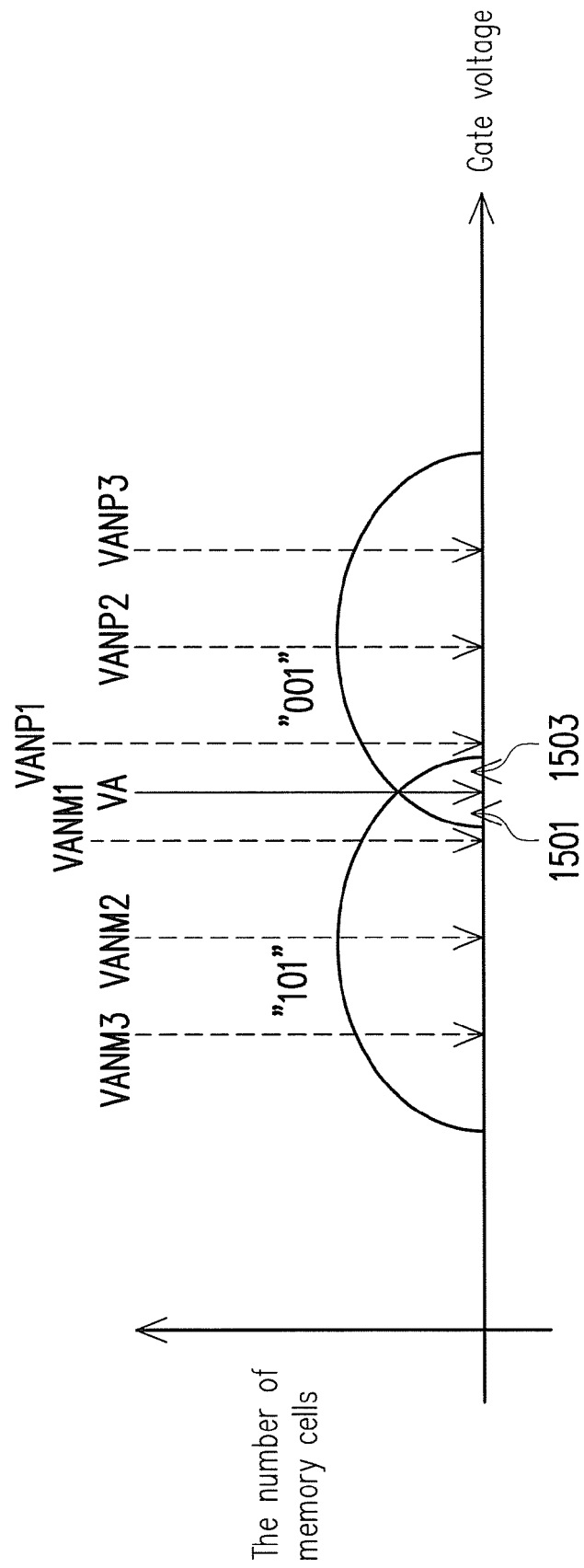
FIG. 15 is a schematic diagram of obtaining soft values from memory cells to be read with a set of normal adjustment read voltage according to an exemplary embodiment.

FIG. 15 is a schematic diagram of obtaining soft values from memory cells to be read with a set of normal adjustment read voltage according to another exemplary embodiment. In order to explain easily, an example of applying the first read voltage VA to a word line connected to memory cells constituted one lower page to read data is shown in FIG. 15.

Referring to FIG. 15, when the memory controller 104 (or the memory management circuit 202) indicates applying the first read voltage VA to a word line (herein referred to as "the first word line") to deter nine the storage state of the memory cells on the first word line, because the critical voltage distribution of the memory cells on the first word line has become wide, the storage state of the memory cells in a block 1501 should be in the storage state "001" but are mistaken as being in the storage state "101" and the storage state of the memory cells in a block 1503 should be in the storage state "101" but are mistaken as being in the storage state "001". Therefore, the error checking and correcting circuit 208 can not successfully correct bit data read from the lower physical page by applying the first read voltage VA to generate correct page data.

At this time, the memory controller 104 (or the memory management circuit 202) identifies that a critical voltage distribution of the memory cells connected to the first word line is a normal distribution and indicates applying a set of normal adjustment read voltage to the memory cells connected to the first word line to obtain soft values.

For example, as described above, the memory controller 104 (or the memory management circuit 202) searches or tracks the relative minimum point in the critical voltage distribution of the memory cells connected to a word line to set the first read voltage VA. Therefore, the memory controller 104 (or the memory management circuit 202) may determine whether the critical voltage distribution of the memory cells is skewed, and if the critical voltage distribution of the memory cells is not skewed, the memory controller 104 (or the memory management circuit 202) identifies the critical voltage distribution of the memory cells is the normal distribution.

In the present exemplary embodiment, the set of normal adjustment read voltage corresponding to the first read VA is composed of a plurality of positive adjustment read voltages, which are larger than the first read voltage VA, and a plurality of negative adjustment read voltages, which are smaller than the first read voltage VA, and the number of the positive adjustment read voltages is equal to the number of the negative adjustment read voltages. For example, the set of normal adjustment read voltage corresponding to the first read VA includes positive adjustment read voltages VANP1, VANP2 and VANP3 and negative adjustment read voltages VANM1, VANM2 and VANM3. To be specific, because the critical voltage distribution of the memory cells on the first word line is the normal distribution, information (soft values) about the memory cells can be obtained uniformly by applying a set of adjustment read voltage having symmetrical voltages referring to the first read voltage VA. It must be understood that in the present exemplary embodiment, a voltage difference between two adjacent adjustment read voltages is fixed, however, the present invention is not limited thereto. In another embodiment, a voltage difference between two adjacent adjustment read voltages may be un-fixed.

It must be understood that the manner of setting the set of normal adjustment read voltage corresponding to the first read voltage VA may applied in a set of normal adjustment read voltage corresponding to other read voltage. For example, in an exemplary embodiment, when reading a middle physical page, a set of normal adjustment read voltage corresponding to the second read voltage VB and a set of normal adjustment read voltage corresponding to the third read voltage VC are set with a manner being similar to the set of normal adjustment read voltage corresponding to the first read voltage VA, and soft values are read by applying the set of normal adjustment read voltage having symmetrical voltages referring to the second read voltage VB and the set of normal adjustment read voltage having symmetrical voltages referring to the third read voltage VC. For example, in an exemplary embodiment, when reading a upper physical page, a set of normal adjustment read voltage corresponding to the fourth read voltage VD, a set of normal adjustment read voltage corresponding to the fifth read voltage VE, a set of normal adjustment read voltage corresponding to the sixth read voltage VF and a set of normal adjustment read voltage corresponding to the seventh read voltage VG are set with a manner being similar to the set of normal adjustment read voltage corresponding to the first read voltage VA, and soft values are read by applying the set of normal adjustment read voltage having symmetrical voltages referring to the fourth read voltage VD, the set of normal adjustment read voltage having symmetrical voltages referring to the fifth read voltage VE, the set of normal adjustment read voltage having symmetrical voltages referring to the sixth read voltage VF and the set of normal adjustment read voltage having symmetrical voltages referring to the seventh read voltage VG.

Figure 16:
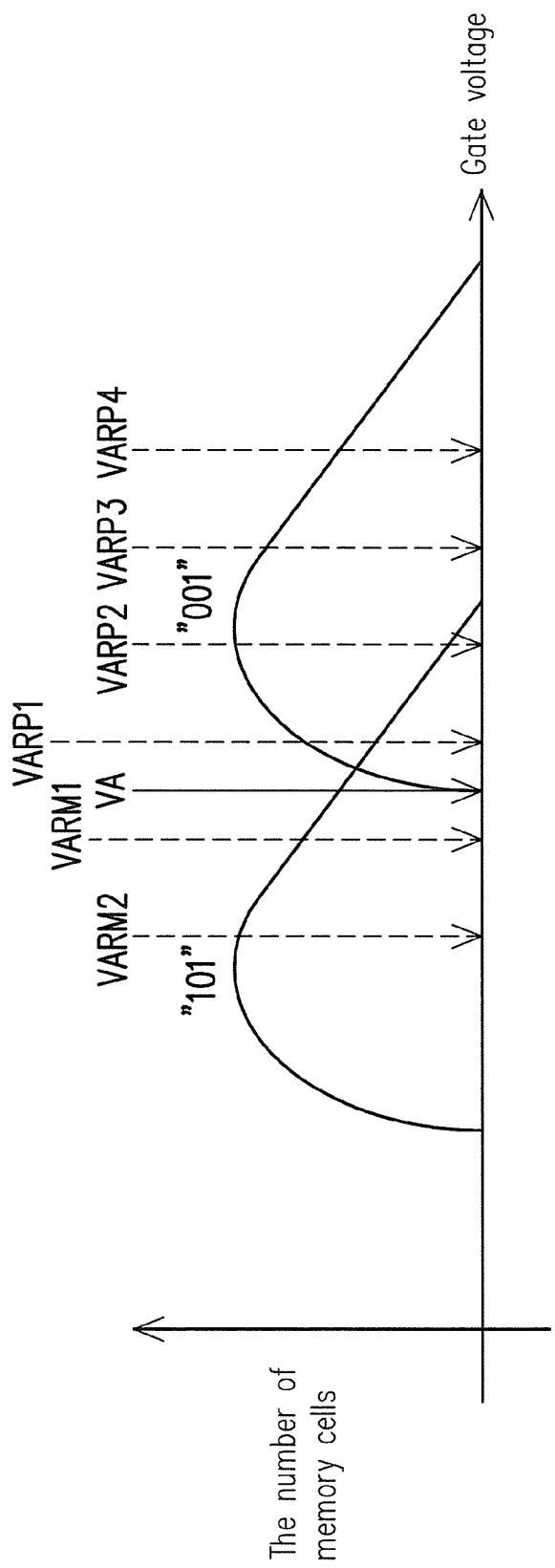
FIG. 16 is a schematic diagram of obtaining soft values from memory cells to be read with a set of right adjustment read voltage according to an exemplary embodiment.

FIG. 16 is a schematic diagram of obtaining soft values from memory cells to be read with a set of right adjustment read voltage according to another exemplary embodiment. In order to explain easily, an example of applying the first read voltage VA to a word line connected to memory cells constituted one lower page to read data is shown in FIG. 16.

Referring to FIG. 16, when the error checking and correcting circuit 208 can not correct bit data read from the lower physical page by applying the first read voltage VA, the memory controller 104 (or the memory management circuit 202) identifies that a critical voltage distribution of the memory cells connected to the first word line is a right-offset distribution and indicates applying a set of right adjustment read voltage to the memory cells connected to the first word line to obtain soft values.

For example, the memory controller 104 (or the memory management circuit 202) searches or tracks the relative minimum point in the critical voltage distribution of the memory cells connected to a word line to set the first read voltage VA, thereby identifying the critical voltage distribution of the memory cells is the right-offset distribution.

In the present exemplary embodiment, the set of right adjustment read voltage corresponding to the first read voltage VA is composed of a plurality of positive adjustment read voltages, which are larger than the first read voltage VA, and a plurality of negative adjustment read voltages, which are smaller than the first read voltage VA, and the number of the positive adjustment read voltages is larger than the number of the negative adjustment read voltages. For example, the set of right adjustment read voltage corresponding to the first read voltage VA includes positive adjustment read voltages VARP1, VARP2, VARP3 and VARP4 and negative adjustment read voltages VARM1 and VARM2. To be specific, because the critical voltage distribution of the memory cells on the first word line is the right-offset distribution, there are more memory cells identified mistakenly in the memory cells whose gate voltage is larger than the first read voltage VA. Therefore, the error checking and correcting circuit 208 may successfully execute the error checking and correcting procedure based on infatuation from soft values obtained by applying more positive adjustment read voltages larger than the first read voltage VA.

It must be understood that the manner of setting the set of right adjustment read voltage corresponding to the first read voltage VA may applied in a set of right adjustment read voltage corresponding to other read voltage. For example, in an exemplary embodiment, when reading a middle physical page, a set of right adjustment read voltage corresponding to the second read voltage VB and a set of right adjustment read voltage corresponding to the third read voltage VC are set to read soft values with a manner being similar to the set of right adjustment read voltage corresponding to the first read voltage VA. For example, in an exemplary embodiment, when reading a upper physical page, a set of right adjustment read voltage corresponding to the fourth read voltage VD, a set of right normal adjustment read voltage corresponding to the fifth read voltage VE, a set of right adjustment read voltage corresponding to the sixth read voltage VF and a set of right adjustment read voltage corresponding to the seventh read voltage VG are set to read soft values with a manner being similar to the set of right adjustment read voltage corresponding to the first read voltage VA.

Figure 17:
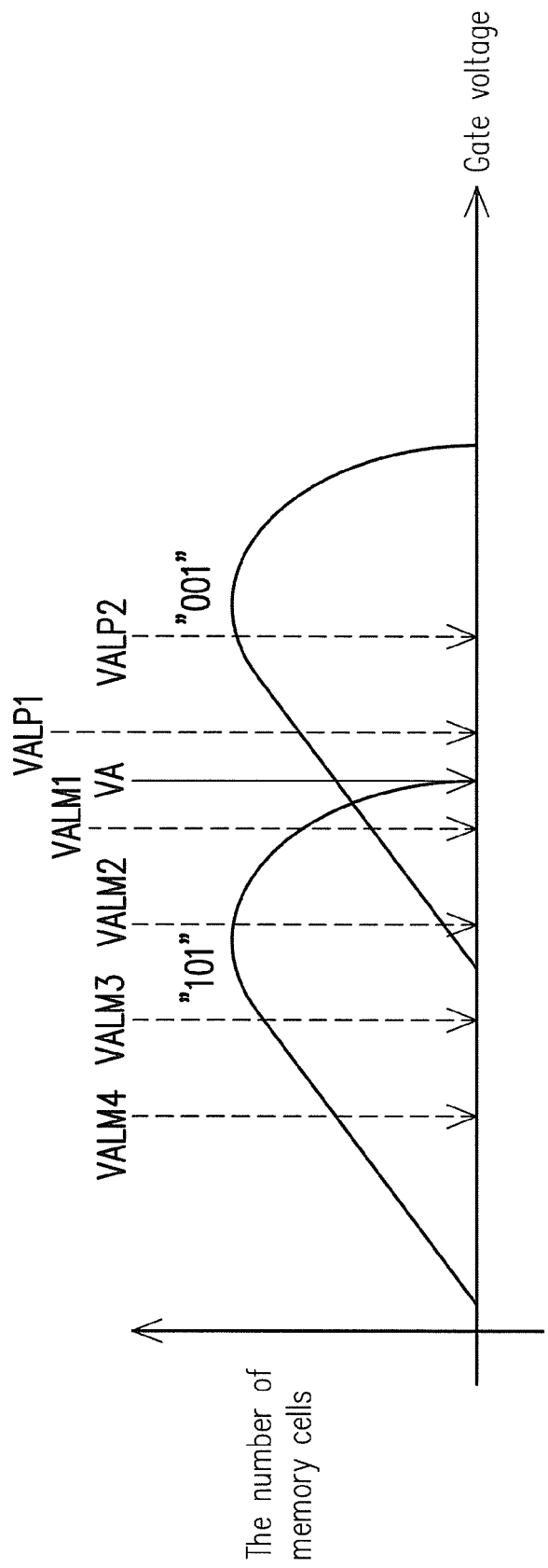
FIG. 17 is a schematic diagram of obtaining soft values from memory cells to be read with a set of left adjustment read voltage according to an exemplary embodiment.

FIG. 17 is a schematic diagram of obtaining soft values from memory cells to be read with a set of left adjustment read voltage according to another exemplary embodiment. In order to explain easily, an example of applying the first read voltage VA to a word line connected to memory cells constituted one lower page to read data is shown in FIG. 17.

Referring to FIG. 17, when the error checking and correcting circuit 208 can not correct bit data read from the lower physical page by applying the first read voltage VA, the memory controller 104 (or the memory management circuit 202) identifies that a critical voltage distribution of the memory cells connected to the first word line is a left-offset distribution and indicates applying a set of left adjustment read voltage to the memory cells connected to the first word line to obtain soft values.

For example, the memory controller 104 (or the memory management circuit 202) searches or tracks the relative minimum point in the critical voltage distribution of the memory cells connected to a word line to set the first read voltage VA, thereby identifying the critical voltage distribution of the memory cells is the left-offset distribution.

In the present exemplary embodiment, the set of left adjustment read voltage corresponding to the first read voltage VA is composed of a plurality of positive adjustment read voltages, which are larger than the first read voltage VA, and a plurality of negative adjustment read voltages, which are smaller than the first read voltage VA, and the number of the negative adjustment read voltages is larger than the number of the positive adjustment read voltages. For example, the set of left adjustment read voltage corresponding to the first read voltage VA includes positive adjustment read voltages VALP1 and VALP2 and negative adjustment read voltages VALM1, VARLM2, VARLM3, and VALM4. To be specific, because the critical voltage distribution of the memory cells on the first word line is the left-offset distribution, there are more memory cells identified mistakenly in the memory cells whose gate voltage is smaller than the first read voltage VA. Therefore, the error checking and correcting circuit 208 may successfully execute the error checking and correcting procedure based on information from soft values obtained by applying more negative adjustment read voltages smaller than the first read voltage VA.

It must be understood that the manner of setting the set of left adjustment read voltage corresponding to the first read voltage VA may applied in a set of left adjustment read voltage corresponding to other read voltage. For example, in an exemplary embodiment, when reading a middle physical page, a set of left adjustment read voltage corresponding to the second read voltage VB and a set of left adjustment read voltage corresponding to the third read voltage VC are set to read soft values with a manner being similar to the set of left adjustment read voltage corresponding to the first read voltage VA. For example, in an exemplary embodiment, when reading a upper physical page, a set of left adjustment read voltage corresponding to the fourth read voltage VD, a set of left normal adjustment read voltage corresponding to the fifth read voltage VE, a set of left adjustment read voltage corresponding to the sixth read voltage VF and a set of left adjustment read voltage corresponding to the seventh read voltage VG are set to read soft values with a manner being similar to the set of left adjustment read voltage corresponding to the first read voltage VA.

Figure 18:
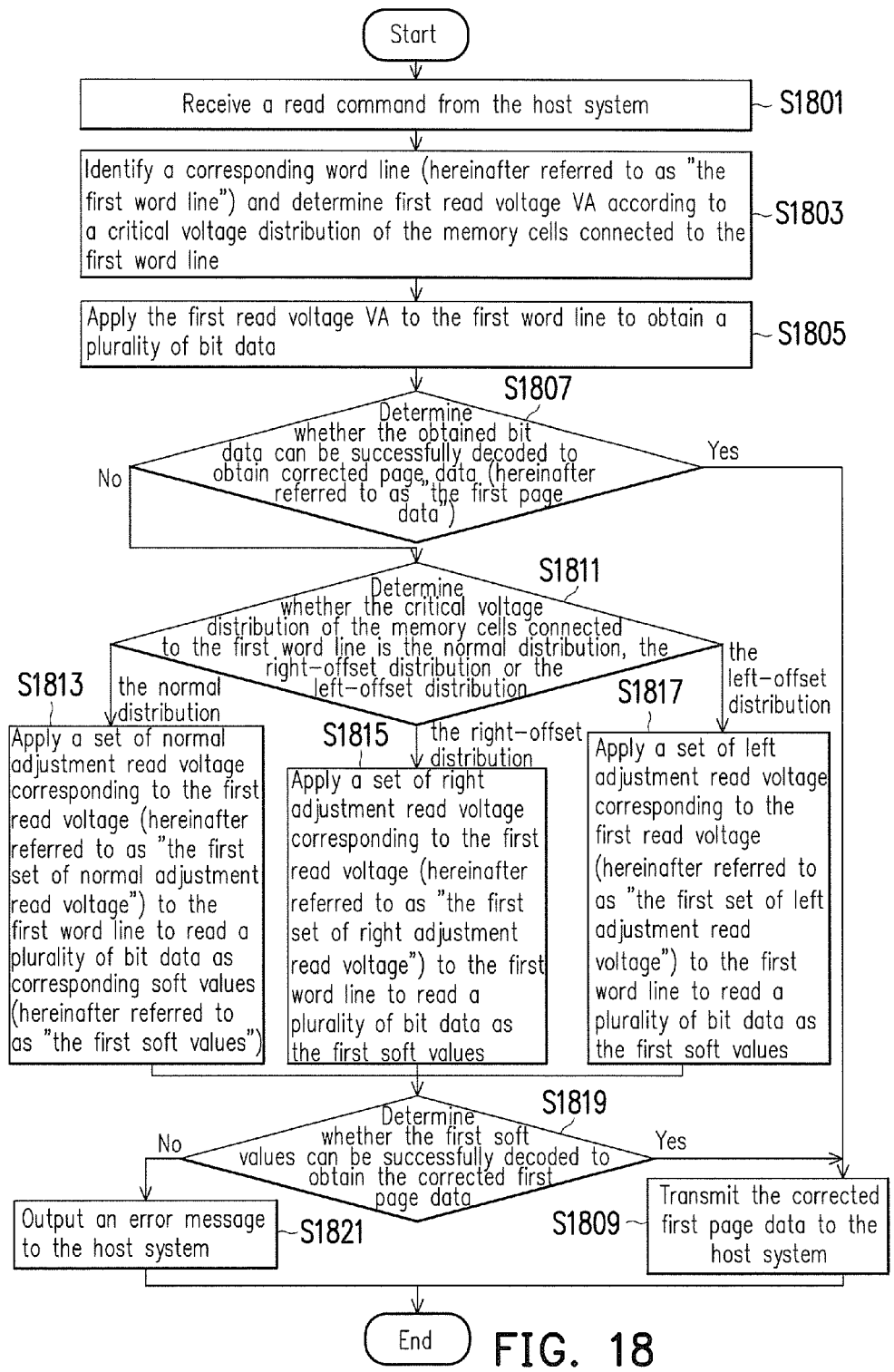
FIG. 18 is a flowchart illustrating the data reading method for reading a lower physical page according to one exemplary embodiment of the present invention.

FIG. 18 is a flowchart illustrating the data reading method for reading a lower physical page according to one exemplary embodiment of the present invention.

Referring to FIG. 18, in step S1801, the memory controller 104 (or the memory management circuit 202) receives a read command from the host system 1000.

Then, in step S1803, the memory controller 104 (or the memory management circuit 202) identifies a corresponding word line (hereinafter referred to as "the first word line") and determines first read voltage VA according to a critical voltage distribution of the memory cells connected to the first word line.

In step S1805, the memory controller 104 (or the memory management circuit 202) applies the first read voltage VA to the first word line to obtain a plurality of bit data.

In step S1807, the memory controller 104 (or the error checking and correcting circuit 208) determines whether the obtained bit data can be successfully decoded to obtain corrected page data (hereinafter referred to as "the first page data").

If the obtained bit data can be successfully decoded to obtain the corrected first page data, in step S1809, the memory controller 104 (or the memory management circuit 202) transmits the corrected first page data to the host system 1000.

If the obtained bit data can not be successfully decoded to obtain the corrected first page data, in step S1811, the memory controller 104 (or the memory management circuit 202) determines whether the critical voltage distribution of the memory cells connected to the first word line is the normal distribution, the right-offset distribution or the left-offset distribution.

If the critical voltage distribution of the memory cells connected to the first word line is the normal distribution, in step S1813, the memory controller 104 (or the memory management circuit 202) applies a set of normal adjustment read voltage corresponding to the first read voltage (hereinafter referred to as "the first set of normal adjustment read voltage") to the first word line to read a plurality of bit data as corresponding soft values (hereinafter referred to as "the first soft values").

If the critical voltage distribution of the memory cells connected to the first word line is the right-offset distribution, in step S1815, the memory controller 104 (or the memory management circuit 202) applies a set of right adjustment read voltage corresponding to the first read voltage (hereinafter referred to as "the first set of right adjustment read voltage") to the first word line to read a plurality of bit data as the first soft values.

If the critical voltage distribution of the memory cells connected to the first word line is the left-offset distribution, in step S1817, the memory controller 104 (or the memory management circuit 202) applies a set of left adjustment read voltage corresponding to the first read voltage (hereinafter referred to as "the first set of left adjustment read voltage") to the first word line to read a plurality of bit data as the first soft values.

Then, in step S1819, the memory controller 104 (or the error checking and correcting circuit 208) determines whether the first soft values can be successfully decoded to obtain the corrected first page data.

If the first soft values can be successfully decoded to obtain the corrected first page data, step S1809 is performed. And, if the first soft values can not be successfully decoded to obtain the corrected first page data, in step S1821, the memory controller 104 (or the error checking and correcting circuit 208) outputs an error message to the host system 1000.

Although the flowchart shown in FIG. 18 only describes the method obtaining soft values by applying the first set of normal adjustment read voltage, the first set of right adjustment read voltage or the first set of left adjustment read voltage according to the critical voltage distribution of the memory cells and thereby obtaining the corrected first page data stored in the lower page, the method may applied to read a middle physical page and a upper physical page. For example, in a case where a milled physical page is read, if bit data obtained by applying the second read voltage VB and the third read voltage VC can not be decoded to obtain corresponding page data (hereinafter referred to as "the second page data"), the memory controller 104 (or the memory management circuit 202) applies the sets of normal adjustment read voltage, the sets of right adjustment read voltage or the sets of left adjustment read voltage corresponding to the second read voltage VB and the third read voltage VC according to the critical voltage distribution of the memory cells to obtain soft values and decodes the obtained soft values to obtain corrected the second page data. For example, in a case where a upper physical page is read, if bit data obtained by applying the fourth read voltage VD, the fifth read voltage VE, the sixth read voltage VF and the seventh read voltage VG can not be decoded to obtain corresponding page data (hereinafter referred to as "the third page data"), the memory controller 104 (or the memory management circuit 202) applies the sets of normal adjustment read voltage, the sets of right adjustment read voltage or the sets of left adjustment read voltage corresponding to the fourth read voltage VD, the fifth read voltage VE, the sixth read voltage VF and the seventh read voltage VG according to the critical voltage distribution of the memory cells to obtain soft values and decodes the obtained soft values to obtain the corrected third page data.

It should be mentioned that even though the memory management circuit 202 is implemented within the memory controller 104 in the present exemplary embodiment, the present invention is not limited thereto. In another exemplary embodiment, the memory management circuit 202 may be implemented within the control circuit of the rewritable non-volatile memory module 106 and is electrically connected to the memory array 2202 of the rewritable non-volatile memory module 106.

In view of the above, the data reading method, the control circuit, the rewritable non-volatile memory module and the memory storage apparatus of the exemplary embodiments of the present invention can apply suitable adjustment read voltages based on a critical voltage distribution of memory cells to obtain soft values, thereby enhancing the capability of correcting data and preventing data stored in the memory cells from losing. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data reading method for a rewritable non-volatile memory module, wherein the rewritable non-volatile memory module has a plurality of memory cells, a plurality of word lines and a plurality of bit lines, the data reading method comprising:

determining a first read voltage corresponding to a plurality of memory cells of a first word line among the word lines based on a critical voltage distribution of the memory cells of the first word line;

determining whether the critical voltage distribution of the memory cells of the first word line is a normal distribution, a right-offset distribution or a left-offset distribution;

if the critical voltage distribution of the memory cells of the first word line is the right-offset distribution, applying a first set of right adjustment read voltage corresponding to the first read voltage to the first word line to read a plurality of bit data as first soft values corresponding to the memory cells of the first word line; and decoding the first soft values corresponding to the memory cells of the first word line to obtain first page data stored in the memory cells of the first word line, wherein the first set of right adjustment voltage includes a plurality of positive adjustment read voltages and a plurality of negative adjustment read voltages, each of the positive adjustment read voltages of the first set of right adjustment voltage is larger than the first read voltage, each of the negative adjustment read voltages of the first set of right adjustment voltage is smaller than the first read voltage, and the number of the positive adjustment read voltages of the first set of right adjustment voltage is larger than the number of the negative adjustment read voltages of the first set of right adjustment voltage.

2. The data reading method according to claim 1, further comprising:

if the critical voltage distribution of the memory cells of the first word line is the left-offset distribution, applying a first set of left adjustment read voltage corresponding to the first read voltage to the first word line to obtain the first soft values corresponding to the memory cells of the first word line, wherein the first set of left adjustment voltage includes a plurality of positive adjustment read voltages and a plurality of negative adjustment read voltages, each of the positive adjustment read voltages of the first set of left adjustment voltage is larger than the first read voltage, each of the negative adjustment read voltages of the first set of left adjustment voltage is smaller than the first read voltage, and the number of the negative adjustment read voltages of the first set of left adjustment voltage is larger than the number of the positive adjustment read voltages of the first set of left adjustment voltage.

3. The data reading method according to claim 1, further comprising:

if the critical voltage distribution of the memory cells of the first word line is the normal distribution, applying a first set of normal adjustment read voltage corresponding to the first read voltage to the first word line to read a plurality of bit data as the first soft values corresponding to the memory cells of the first word line, wherein the first set of normal adjustment voltage includes a plurality of positive adjustment read voltages and a plurality of negative adjustment read voltages, each of the positive adjustment read voltages of the first set of normal adjustment voltage is larger than the first read voltage, each of the negative adjustment read voltages of the first set of normal adjustment voltage is smaller than the first read voltage, and the number of the positive adjustment read voltages of the first set of normal adjustment voltage is equal to the number of the negative adjustment read voltages of the first set of normal adjustment voltage.

4. The data reading method according to claim 1, further comprising:

determining a second read voltage and a third read voltage corresponding to the memory cells of the first word line based on the critical voltage distribution of the memory cells of the first word line;

if the critical voltage distribution of the memory cells of the first word line is the right-offset distribution, applying a second set of right adjustment read voltage corresponding to the second read voltage and a third set of right adjustment read voltage corresponding to the third read voltage to the first word line to read a plurality of bit data as second soft values corresponding to the memory cells of the first word line; and decoding the second soft values corresponding to the memory cells of the first word line to obtain second page data stored in the memory cells of the first word line, wherein the second set of right adjustment voltage includes a plurality of positive adjustment read voltages and a plurality of negative adjustment read voltages, each of the positive adjustment read voltages of the second set of right adjustment voltage is larger than the second read voltage, each of the negative adjustment read voltages of the second set of right adjustment voltage is smaller than the second read voltage, and the number of the positive adjustment read voltages of the second set of right adjustment voltage is larger than the number of the negative adjustment read voltages of the second set of right adjustment voltage, wherein the third set of right adjustment voltage includes a plurality of positive adjustment read voltages and a plurality of negative adjustment read voltages, each of the positive adjustment read voltages of the third set of right adjustment voltage is larger than the third read voltage, each of the negative adjustment read voltages of the third set of right adjustment voltage is smaller than the third read voltage, and the number of the positive adjustment read voltages of the third set of right adjustment voltage is larger than the number of the negative adjustment read voltages of the third set of right adjustment voltage.

5. The data reading method according to claim 4, further comprising:

determining a fourth read voltage, a fifth read voltage, a sixth read voltage and a seventh read voltage corresponding to the memory cells of the first word line based on the critical voltage distribution of the memory cells of the first word line;

if the critical voltage distribution of the memory cells of the first word line is the right-offset distribution, applying a fourth set of right adjustment read voltage corresponding to the fourth read voltage, a fifth set of right adjustment read voltage corresponding to the fifth read voltage, a sixth set of right adjustment read voltage corresponding to the sixth read voltage and a seventh set of right adjustment read voltage corresponding to the seventh read voltage to the first word line to read a plurality of bit data as third soft values corresponding to the memory cells of the first word line; and decoding the third soft values corresponding to the memory cells of the first word line to obtain third page data stored in the memory cells of the first word line, wherein the fourth set of right adjustment voltage includes a plurality of positive adjustment read voltages and a plurality of negative adjustment read voltages, each of the positive adjustment read voltages of the fourth set of right adjustment voltage is larger than the fourth read voltage, each of the negative adjustment read voltages of the fourth set of right adjustment voltage is smaller than the fourth read voltage, and the number of the positive adjustment read voltages of the fourth set of right adjustment voltage is larger than the number of the negative adjustment read voltages of the fourth set of right adjustment voltage, wherein the fifth set of right adjustment voltage includes a plurality of positive adjustment read voltages and a plurality of negative adjustment read voltages, each of the positive adjustment read voltages of the fifth set of right adjustment voltage is larger than the fifth read voltage, each of the negative adjustment read voltages of the fifth set of right adjustment voltage is smaller than the fifth read voltage, and the number of the positive adjustment read voltages of the fifth set of right adjustment voltage is larger than the number of the negative adjustment read voltages of the fifth set of right adjustment voltage, wherein the sixth set of right adjustment voltage includes a plurality of positive adjustment read voltages and a plurality of negative adjustment read voltages, each of the positive adjustment read voltages of the sixth set of right adjustment voltage is larger than the sixth read voltage, each of the negative adjustment read voltages of the sixth set of right adjustment voltage is smaller than the sixth read voltage, and the number of the positive adjustment read voltages of the sixth set of right adjustment voltage is larger than the number of the negative adjustment read voltages of the sixth set of right adjustment voltage, wherein the seventh set of right adjustment voltage includes a plurality of positive adjustment read voltages and a plurality of negative adjustment read voltages, each of the positive adjustment read voltages of the seventh set of right adjustment voltage is larger than the seventh read voltage, each of the negative adjustment read voltages of the seventh set of right adjustment voltage is smaller than the seventh read voltage, and the number of the positive adjustment read voltages of the seventh set of right adjustment voltage is larger than the number of the negative adjustment read voltages of the seventh set of right adjustment voltage.

6. A control circuit for reading data from a plurality of memory cells of a rewritable non-volatile memory module, the control circuit comprising:

an interface configured to electrically connected to the memory cells, a plurality of word lines and a plurality of bit lines;

an error checking and correcting circuit; and a memory management circuit coupled to the interface and the error checking and correcting circuit, wherein the memory management circuit is configured to determine a first read voltage corresponding to a plurality of memory cells of a first word line among the word lines based on a critical voltage distribution of the memory cells of the first word line, wherein the memory management circuit is further configured to determine whether the critical voltage distribution of the memory cells of the first word line is a normal distribution, a right-offset distribution or a left-offset distribution, wherein if the critical voltage distribution of the memory cells of the first word line is the right-offset distribution, the memory management circuit is further configured to apply a first set of right adjustment read voltage corresponding to the first read voltage to the first word line to read a plurality of bit data as first soft values corresponding to the memory cells of the first word line, wherein the memory management circuit is further configured to transmit the first soft values corresponding to the memory cells of the first word line to the error checking and correcting circuit and the error checking and correcting circuit decodes the first soft values corresponding to the memory cells of the first word line to obtain first page data stored in the memory cells of the first word line, wherein the first set of right adjustment voltage includes a plurality of positive adjustment read voltages and a plurality of negative adjustment read voltages, each of the positive adjustment read voltages of the first set of right adjustment voltage is larger than the first read voltage, each of the negative adjustment read voltages of the first set of right adjustment voltage is smaller than the first read voltage, and the number of the positive adjustment read voltages of the first set of right adjustment voltage is larger than the number of the negative adjustment read voltages of the first set of right adjustment voltage.

7. The control circuit according to claim 6, wherein if the critical voltage distribution of the memory cells of the first word line is the left-offset distribution, the memory management circuit applies a first set of left adjustment read voltage corresponding to the first read voltage to the first word line to obtain the first soft values corresponding to the memory cells of the first word line, wherein the first set of left adjustment voltage includes a plurality of positive adjustment read voltages and a plurality of negative adjustment read voltages, each of the positive adjustment read voltages of the first set of left adjustment voltage is larger than the first read voltage, each of the negative adjustment read voltages of the first set of left adjustment voltage is smaller than the first read voltage, and the number of the negative adjustment read voltages of the first set of left adjustment voltage is larger than the number of the positive adjustment read voltages of the first set of left adjustment voltage.

8. The control circuit according to claim 6, wherein if the critical voltage distribution of the memory cells of the first word line is the normal distribution, the memory management circuit applies a first set of normal adjustment read voltage corresponding to the first read voltage to the first word line to read a plurality of bit data as the first soft values corresponding to the memory cells of the first word line, wherein the first set of normal adjustment voltage includes a plurality of positive adjustment read voltages and a plurality of negative adjustment read voltages, each of the positive adjustment read voltages of the first set of normal adjustment voltage is larger than the first read voltage, each of the negative adjustment read voltages of the first set of normal adjustment voltage is smaller than the first read voltage, and the number of the positive adjustment read voltages of the first set of normal adjustment voltage is equal to the number of the negative adjustment read voltages of the first set of normal adjustment voltage.

9. The control circuit according to claim 6, wherein the memory management circuit is further configured to determine a second read voltage and a third read voltage corresponding to the memory cells of the first word line based on the critical voltage distribution of the memory cells of the first word line, wherein if the critical voltage distribution of the memory cells of the first word line is the right-offset distribution, the memory management circuit applies a second set of right adjustment read voltage corresponding to the second read voltage and a third set of right adjustment read voltage corresponding to the third read voltage to the first word line to read a plurality of bit data as second soft values corresponding to the memory cells of the first word line, wherein the memory management circuit is further configured to transmit the second soft values corresponding to the memory cells of the first word line to the error checking and correcting circuit and the error checking and correcting circuit decodes the second soft values corresponding to the memory cells of the first word line to obtain second page data stored in the memory cells of the first word line, wherein the second set of right adjustment voltage includes a plurality of positive adjustment read voltages and a plurality of negative adjustment read voltages, each of the positive adjustment read voltages of the second set of right adjustment voltage is larger than the second read voltage, each of the negative adjustment read voltages of the second set of right adjustment voltage is smaller than the second read voltage, and the number of the positive adjustment read voltages of the second set of right adjustment voltage is larger than the number of the negative adjustment read voltages of the second set of right adjustment voltage, wherein the third set of right adjustment voltage includes a plurality of positive adjustment read voltages and a plurality of negative adjustment read voltages, each of the positive adjustment read voltages of the third set of right adjustment voltage is larger than the third read voltage, each of the negative adjustment read voltages of the third set of right adjustment voltage is smaller than the third read voltage, and the number of the positive adjustment read voltages of the third set of right adjustment voltage is larger than the number of the negative adjustment read voltages of the third set of right adjustment voltage.

10. The control circuit according to claim 9, wherein the memory management circuit is further configured to determine a fourth read voltage, a fifth read voltage, a sixth read voltage and a seventh read voltage corresponding to the memory cells of the first word line based on the critical voltage distribution of the memory cells of the first word line, wherein if the critical voltage distribution of the memory cells of the first word line is the right-offset distribution, the memory management circuit applies a fourth set of right adjustment read voltage corresponding to the fourth read voltage, a fifth set of right adjustment read voltage corresponding to the fifth read voltage, a sixth set of right adjustment read voltage corresponding to the sixth read voltage and a seventh set of right adjustment read voltage corresponding to the seventh read voltage to the first word line to read a plurality of bit data as third soft values corresponding to the memory cells of the first word line, wherein the memory management circuit is further configured to transmit the third soft values corresponding to the memory cells of the first word line to the error checking and correcting circuit and the error checking and correcting circuit decodes the third soft values corresponding to the memory cells of the first word line to obtain third page data stored in the memory cells of the first word line, wherein the fourth set of right adjustment voltage includes a plurality of positive adjustment read voltages and a plurality of negative adjustment read voltages, each of the positive adjustment read voltages of the fourth set of right adjustment voltage is larger than the fourth read voltage, each of the negative adjustment read voltages of the fourth set of right adjustment voltage is smaller than the fourth read voltage, and the number of the positive adjustment read voltages of the fourth set of right adjustment voltage is larger than the number of the negative adjustment read voltages of the fourth set of right adjustment voltage, wherein the fifth set of right adjustment voltage includes a plurality of positive adjustment read voltages and a plurality of negative adjustment read voltages, each of the positive adjustment read voltages of the fifth set of right adjustment voltage is larger than the fifth read voltage, each of the negative adjustment read voltages of the fifth set of right adjustment voltage is smaller than the fifth read voltage, and the number of the positive adjustment read voltages of the fifth set of right adjustment voltage is larger than the number of the negative adjustment read voltages of the fifth set of right adjustment voltage, wherein the sixth set of right adjustment voltage includes a plurality of positive adjustment read voltages and a plurality of negative adjustment read voltages, each of the positive adjustment read voltages of the sixth set of right adjustment voltage is larger than the sixth read voltage, each of the negative adjustment read voltages of the sixth set of right adjustment voltage is smaller than the sixth read voltage, and the number of the positive adjustment read voltages of the sixth set of right adjustment voltage is larger than the number of the negative adjustment read voltages of the sixth set of right adjustment voltage, wherein the seventh set of right adjustment voltage includes a plurality of positive adjustment read voltages and a plurality of negative adjustment read voltages, each of the positive adjustment read voltages of the seventh set of right adjustment voltage is larger than the seventh read voltage, each of the negative adjustment read voltages of the seventh set of right adjustment voltage is smaller than the seventh read voltage, and the number of the positive adjustment read voltages of the seventh set of right adjustment voltage is larger than the number of the negative adjustment read voltages of the seventh set of right adjustment voltage.

11. A memory storage apparatus, comprising:
a connector coupled to a host system;
a rewritable non-volatile memory module, wherein the rewritable non-volatile memory module has a plurality of memory cells, a plurality of word lines and a plurality of bit lines; and
a memory controller coupled to the connector and the rewritable non-volatile memory module, wherein the memory controller is configured to determine a first read voltage corresponding to memory cells of a first word line among the word lines based on a critical voltage distribution of the memory cells of the first word line,
wherein the memory controller is further configured to determine whether the critical voltage distribution of the memory cells of the first word line is a normal distribution, a right-offset distribution or a left-offset distribution,
wherein if the critical voltage distribution of the memory cells of the first word line is the right-offset distribution, the memory controller is further configured to apply a first set of right adjustment read voltage corresponding to the first read voltage to the first word line to read a plurality of bit data as first soft values corresponding to the memory cells of the first word line, wherein the memory controller is further configured to decode the first soft values corresponding to the memory cells of the first word line to obtain first page data stored in the memory cells of the first word line, wherein the first set of right adjustment voltage includes a plurality of positive adjustment read voltages and a plurality of negative adjustment read voltages, each of the positive adjustment read voltages of the first set of right adjustment voltage is larger than the first read voltage, each of the negative adjustment read voltages of the first set of right adjustment voltage is smaller than the first read voltage, and the number of the positive adjustment read voltages of the first set of right adjustment voltage is larger than the number of the negative adjustment read voltages of the first set of right adjustment voltage.

12. The memory storage apparatus according to claim 11, wherein
if the critical voltage distribution of the memory cells of the first word line is the left-offset distribution, the memory controller applies a first set of left adjustment read voltage corresponding to the first read voltage to the first word line to obtain the first soft values corresponding to the memory cells of the first word line, wherein the first set of left adjustment voltage includes a plurality of positive adjustment read voltages and a plurality of negative adjustment read voltages, each of the positive adjustment read voltages of the first set of left adjustment voltage is larger than the first read voltage, each of the negative adjustment read voltages of the first set of left adjustment voltage is smaller than the first read voltage, and the number of the negative adjustment read voltages of the first set of left adjustment voltage is larger than the number of the positive adjustment read voltages of the first set of left adjustment voltage.

13. The memory storage apparatus according to claim 11, wherein
if the critical voltage distribution of the memory cells of the first word line is the normal distribution, the memory controller applies a first set of normal adjustment read voltage corresponding to the first read voltage to the first word line to read a plurality of bit data as the first soft values corresponding to the memory cells of the first word line, wherein the first set of normal adjustment voltage includes a plurality of positive adjustment read voltages and a plurality of negative adjustment read voltages, each of the positive adjustment read voltages of the first set of normal adjustment voltage is larger than the first read voltage, each of the negative adjustment read voltages of the first set of normal adjustment voltage is smaller than the first read voltage, and the number of the positive adjustment read voltages of the first set of normal adjustment voltage is equal to the number of the negative adjustment read voltages of the first set of normal adjustment voltage.

14. The memory storage apparatus according to claim 11, wherein
the memory controller is further configured to determine a second read voltage and a third read voltage corresponding to the memory cells of the first word line based on the critical voltage distribution of the memory cells of the first word line,
wherein if the critical voltage distribution of the memory cells of the first word line is the right-offset distribution, the memory controller applies a second set of right adjustment read voltage corresponding to the second read voltage and a third set of right adjustment read voltage corresponding to the third read voltage to the first word line to read a plurality of bit data as second soft values corresponding to the memory cells of the first word line, wherein the memory controller is further configured to decode the second soft values corresponding to the memory cells of the first word line to obtain second page data stored in the memory cells of the first word line, wherein the second set of right adjustment voltage includes a plurality of positive adjustment read voltages and a plurality of negative adjustment read voltages, each of the positive adjustment read voltages of the second set of right adjustment voltage is larger than the second read voltage, each of the negative adjustment read voltages of the second set of right adjustment voltage is smaller than the second read voltage, and the number of the positive adjustment read voltages of the second set of right adjustment voltage is larger than the number of the negative adjustment read voltages of the second set of right adjustment voltage, wherein the third set of right adjustment voltage includes a plurality of positive adjustment read voltages and a plurality of negative adjustment read voltages, each of the positive adjustment read voltages of the third set of right adjustment voltage is larger than the third read voltage, each of the negative adjustment read voltages of the third set of right adjustment voltage is smaller than the third read voltage, and the number of the positive adjustment read voltages of the third set of right adjustment voltage is larger than the number of the negative adjustment read voltages of the third set of right adjustment voltage.

15. The memory storage apparatus according to claim 14, wherein
the memory controller is further configured to determine a fourth read voltage, a fifth read voltage, a sixth read voltage and a seventh read voltage corresponding to the memory cells of the first word line based on the critical voltage distribution of the memory cells of the first word line, wherein if the critical voltage distribution of the memory cells of the first word line is the right-offset distribution, the memory controller applies a fourth set of right adjustment read voltage corresponding to the fourth read voltage, a fifth set of right adjustment read voltage corresponding to the fifth read voltage, a sixth set of right adjustment read voltage corresponding to the sixth read voltage and a seventh set of right adjustment read voltage corresponding to the seventh read voltage to the first word line to read a plurality of bit data as third soft values corresponding to the memory cells of the first word line, wherein the memory controller is further configured to decode the third soft values corresponding to the memory cells of the first word line to obtain third page data stored in the memory cells of the first word line, wherein the fourth set of right adjustment voltage includes a plurality of positive adjustment read voltages and a plurality of negative adjustment read voltages, each of the positive adjustment read voltages of the fourth set of right adjustment voltage is larger than the fourth read voltage, each of the negative adjustment read voltages of the fourth set of right adjustment voltage is smaller than the fourth read voltage, and the number of the positive adjustment read voltages of the fourth set of right adjustment voltage is larger than the number of the negative adjustment read voltages of the fourth set of right adjustment voltage, wherein the fifth set of right adjustment voltage includes a plurality of positive adjustment read voltages and a plurality of negative adjustment read voltages, each of the positive adjustment read voltages of the fifth set of right adjustment voltage is larger than the fifth read voltage, each of the negative adjustment read voltages of the fifth set of right adjustment voltage is smaller than the fifth read voltage, and the number of the positive adjustment read voltages of the fifth set of right adjustment voltage is larger than the number of the negative adjustment read voltages of the fifth set of right adjustment voltage, wherein the sixth set of right adjustment voltage includes a plurality of positive adjustment read voltages and a plurality of negative adjustment read voltages, each of the positive adjustment read voltages of the sixth set of right adjustment voltage is larger than the sixth read voltage, each of the negative adjustment read voltages of the sixth set of right adjustment voltage is smaller than the sixth read voltage, and the number of the positive adjustment read voltages of the sixth set of right adjustment voltage is larger than the number of the negative adjustment read voltages of the sixth set of right adjustment voltage, wherein the seventh set of right adjustment voltage includes a plurality of positive adjustment read voltages and a plurality of negative adjustment read voltages, each of the positive adjustment read voltages of the seventh set of right adjustment voltage is larger than the seventh read voltage, each of the negative adjustment read voltages of the seventh set of right adjustment voltage is smaller than the seventh read voltage, and the number of the positive adjustment read voltages of the seventh set of right adjustment voltage is larger than the number of the negative adjustment read voltages of the seventh set of right adjustment voltage.

16. A memory module, comprising:
a plurality of word lines;
a plurality of bit lines;
a plurality of memory cells, wherein each of the memory cells electrically connects to one of the word lines and one of the bit lines; and
a control circuit coupled to the word lines, the bit lines and the memory cells, the control circuit is configured to determine a first read voltage corresponding to a plurality of memory cells of a first word line among the word lines based on a critical voltage distribution of the memory cells of the first word line, wherein the control circuit is further configured to determine whether the critical voltage distribution of the memory cells of the first word line is a normal distribution, a right-offset distribution or a left-offset distribution, wherein if the critical voltage distribution of the memory cells of the first word line is the right-offset distribution, the control circuit is further configured to apply a first set of right adjustment read voltage corresponding to the first read voltage to the first word line to read a plurality of bit data as first soft values corresponding to the memory cells of the first word line, wherein the control circuit is further configured to decode the first soft values corresponding to the memory cells of the first word line to obtain first page data stored in the memory cells of the first word line, wherein the first set of right adjustment voltage includes a plurality of positive adjustment read voltages and a plurality of negative adjustment read voltages, each of the positive adjustment read voltages of the first set of right adjustment voltage is larger than the first read voltage, each of the negative adjustment read voltages of the first set of right adjustment voltage is smaller than the first read voltage, and the number of the positive adjustment read voltages of the first set of right adjustment voltage is larger than the number of the negative adjustment read voltages of the first set of right adjustment voltage.

17. The memory module according to claim 16, wherein if the critical voltage distribution of the memory cells of the first word line is the left-offset distribution, the control circuit applies a first set of left adjustment read voltage corresponding to the first read voltage to the first word line to obtain the first soft values corresponding to the memory cells of the first word line, wherein the first set of left adjustment voltage includes a plurality of positive adjustment read voltages and a plurality of negative adjustment read voltages, each of the positive adjustment read voltages of the first set of left adjustment voltage is larger than the first read voltage, each of the negative adjustment read voltages of the first set of left adjustment voltage is smaller than the first read voltage, and the number of the negative adjustment read voltages of the first set of left adjustment voltage is larger than the number of the positive adjustment read voltages of the first set of left adjustment voltage.

18. The memory module according to claim 16, wherein if the critical voltage distribution of the memory cells of the first word line is the normal distribution, the control circuit applies a first set of normal adjustment read voltage corresponding to the first read voltage to the first word line to read a plurality of bit data as the first soft values corresponding to the memory cells of the first word line, wherein the first set of normal adjustment voltage includes a plurality of positive adjustment read voltages and a plurality of negative adjustment read voltages, each of the positive adjustment read voltages of the first set of normal adjustment voltage is larger than the first read voltage, each of the negative adjustment read voltages of the first set of normal adjustment voltage is smaller than the first read voltage, and the number of the positive adjustment read voltages of the first set of normal adjustment voltage is equal to the number of the negative adjustment read voltages of the first set of normal adjustment voltage.

19. The memory module according to claim 16, wherein the control circuit is further configured to determine a second read voltage and a third read voltage corresponding to the memory cells of the first word line based on the critical voltage distribution of the memory cells of the first word line, wherein if the critical voltage distribution of the memory cells of the first word line is the right-offset distribution, the control circuit applies a second set of right adjustment read voltage corresponding to the second read voltage and a third set of right adjustment read voltage corresponding to the third read voltage to the first word line to read a plurality of bit data as second soft values corresponding to the memory cells of the first word line, wherein the control circuit is further configured to decode the second soft values corresponding to the memory cells of the first word line to obtain second page data stored in the memory cells of the first word line, wherein the second set of right adjustment voltage includes a plurality of positive adjustment read voltages and a plurality of negative adjustment read voltages, each of the positive adjustment read voltages of the second set of right adjustment voltage is larger than the second read voltage, each of the negative adjustment read voltages of the second set of right adjustment voltage is smaller than the second read voltage, and the number of the positive adjustment read voltages of the second set of right adjustment voltage is larger than the number of the negative adjustment read voltages of the second set of right adjustment voltage, wherein the third set of right adjustment voltage includes a plurality of positive adjustment read voltages and a plurality of negative adjustment read voltages, each of the positive adjustment read voltages of the third set of right adjustment voltage is larger than the third read voltage, each of the negative adjustment read voltages of the third set of right adjustment voltage is smaller than the third read voltage, and the number of the positive adjustment read voltages of the third set of right adjustment voltage is larger than the number of the negative adjustment read voltages of the third set of right adjustment voltage.

20. The memory module according to claim 19, wherein the control circuit is further configured to determine a fourth read voltage, a fifth read voltage, a sixth read voltage and a seventh read voltage corresponding to the memory cells of the first word line based on the critical voltage distribution of the memory cells of the first word line, wherein if the critical voltage distribution of the memory cells of the first word line is the right-offset distribution, the control circuit applies a fourth set of right adjustment read voltage corresponding to the fourth read voltage, a fifth set of right adjustment read voltage corresponding to the fifth read voltage, a sixth set of right adjustment read voltage corresponding to the sixth read voltage and a seventh set of right adjustment read voltage corresponding to the seventh read voltage to the first word line to read a plurality of bit data as third soft values corresponding to the memory cells of the first word line, wherein the control circuit is further configured to decode the third soft values corresponding to the memory cells of the first word line to obtain third page data stored in the memory cells of the first word line, wherein the fourth set of right adjustment voltage includes a plurality of positive adjustment read voltages and a plurality of negative adjustment read voltages, each of the positive adjustment read voltages of the fourth set of right adjustment voltage is larger than the fourth read voltage, each of the negative adjustment read voltages of the fourth set of right adjustment voltage is smaller than the fourth read voltage, and the number of the positive adjustment read voltages of the fourth set of right adjustment voltage is larger than the number of the negative adjustment read voltages of the fourth set of right adjustment voltage, wherein the fifth set of right adjustment voltage includes a plurality of positive adjustment read voltages and a plurality of negative adjustment read voltages, each of the positive adjustment read voltages of the fifth set of right adjustment voltage is larger than the fifth read voltage, each of the negative adjustment read voltages of the fifth set of right adjustment voltage is smaller than the fifth read voltage, and the number of the positive adjustment read voltages of the fifth set of right adjustment voltage is larger than the number of the negative adjustment read voltages of the fifth set of right adjustment voltage, wherein the sixth set of right adjustment voltage includes a plurality of positive adjustment read voltages and a plurality of negative adjustment read voltages, each of the positive adjustment read voltages of the sixth set of right adjustment voltage is larger than the sixth read voltage, each of the negative adjustment read voltages of the sixth set of right adjustment voltage is smaller than the sixth read voltage, and the number of the positive adjustment read voltages of the sixth set of right adjustment voltage is larger than the number of the negative adjustment read voltages of the sixth set of right adjustment voltage, wherein the seventh set of right adjustment voltage includes a plurality of positive adjustment read voltages and a plurality of negative adjustment read voltages, each of the positive adjustment read voltages of the seventh set of right adjustment voltage is larger than the seventh read voltage, each of the negative adjustment read voltages of the seventh set of right adjustment voltage is smaller than the seventh read voltage, and the number of the positive adjustment read voltages of the seventh set of right adjustment voltage is larger than the number of the negative adjustment read voltages of the seventh set of right adjustment voltage.

\* \* \* \* \*